United States Patent [19]

Stiffler et al.

[11] Patent Number: 4,819,154

[45] Date of Patent: Apr. 4, 1989

[54] MEMORY BACK UP SYSTEM WITH ONE CACHE MEMORY AND TWO PHYSICALLY SEPARATED MAIN MEMORIES

[75] Inventors: Jack J. Stiffler, Concord; Michael J. Budwey; James M. Nolan, Jr., both of Holliston, all of Mass.

[73] Assignee: Sequoia Systems, Inc., Marlborough, Mass.

[21] Appl. No.: 937,978

[22] Filed: Dec. 4, 1986

Related U.S. Application Data

[63] Continuation of Ser. No. 750,652, Jun. 28, 1985, Pat. No. 4,654,819, which is a continuation of Ser. No. 448,419, Dec. 9, 1982, abandoned.

[51] Int. Cl.⁴ .............................................. G06Z 11/16
[52] U.S. Cl. ..................................... 364/200; 371/12
[58] Field of Search ............................. 371/10, 12, 7; 364/200 MS File, 900 MS File

[56] References Cited

U.S. PATENT DOCUMENTS

| | | | |
|---|---|---|---|
| 3,588,829 | 6/1971 | Boland | 364/200 |
| 3,736,566 | 8/1973 | Anderson et al. | 364/200 |
| 3,761,881 | 9/1973 | Anderson et al. | 364/200 |
| 3,889,237 | 6/1975 | Alferness et al. | 364/200 |
| 3,979,726 | 9/1976 | Lange et al. | 364/200 |
| 4,020,466 | 4/1977 | Cordi et al. | 364/200 |
| 4,044,337 | 8/1977 | Hicks et al. | 364/200 |
| 4,228,496 | 10/1980 | Katzman et al. | 364/200 |
| 4,395,500 | 7/1983 | Imazeki et al. | 364/200 |
| 4,403,284 | 9/1983 | Scarisen et al. | 364/200 |
| 4,413,327 | 11/1983 | Sabo et al. | 364/900 |
| 4,426,682 | 1/1984 | Riffe et al. | 364/200 |
| 4,484,273 | 11/1984 | Stiffler et al. | 364/200 |
| 4,566,106 | 1/1986 | Check, Jr. | 371/21 X |

FOREIGN PATENT DOCUMENTS

| | | | |
|---|---|---|---|
| 55-41528 | 3/1980 | Japan | 371/10 |
| 55-115121 | 9/1980 | Japan | 371/10 |
| 58-31651 | 2/1983 | Japan . | |

Primary Examiner—Raulfe B. Zache
Assistant Examiner—Thomas C. Lee
Attorney, Agent, or Firm—Wolf, Greenfield & Sacks

[57] ABSTRACT

Apparatus for maintaining duplicate copies of information stored in fault-tolerant computer main memories is disclosed. A non write-through cache memory associated with each of the system's processing elements stores computations generated by that processing element. At a context switch, the stored information is sequentially written to two separate main memory units. A separate status area in main memory is updated by the processing element both before and after each writing operation so that a fault occurring during data processing or during any storage operation leaves the system with sufficient information to be able to reconstruct the data without loss of integrity.

To efficiently transfer information between the cache memory and the system main memories without consuming a large amount of processing time at context switches, a block status memory associated with the cache memory contains an entry for each data block in the cache memory. The entry indicates whether the corresponding data block has been modified during data processing or written with computational data from the processing element. The storage operations are carried out by high-speed hardware which stores only the modified data blocks. Additional special-purpose hardware simultaneously invalidates all cache memory entries so that a new task can be loaded and started.

24 Claims, 11 Drawing Sheets

SHEET 1

SHEET 2

SHEET 1

SHEET 2

BLOCK STATUS MEMORY LOCAL ADDRESS BUS

F1

LOCAL DATA BUS

F2

CACHE FLUSH LOCAL ADDRESS BUS

G1

LOCAL DATA BUS (WRITE ONLY, 0'S ON READ)

G2

H1

SHEET 3

MEMORY BACK UP SYSTEM WITH ONE CACHE MEMORY AND TWO PHYSICALLY SEPARATED MAIN MEMORIES

This application is a continuation of application Ser. No. 750,652, filed June 28, 1985, now U.S. Pat. No. 4,654,819 which is a continuation of application Ser. No. 448,419 filed Dec. 9, 1982 now abandoned.

FIELD OF THE INVENTION

This invention relates to fault-tolerant computers in general and, in particular, to memory backup systems for fault-tolerant computers.

BACKGROUND OF THE INVENTION

Many computer systems are designed to be "fault-tolerant". Typically, these systems can experience one or more temporary or permanent circuit failures and continue to function without loss of data or without introducing serious errors into the data. Such systems typically vary as to how many faults can be "tolerated" and as to how each fault is handled.

In order to be fully fault-tolerant, a computer must be able to survive a fault which renders one or more portions of its main memory inoperative. In such a situation, to avoid losing or corrupting data, it is necessary to have a second, or backup copy, of the data available in a separate memory location which cannot be disabled by the original fault. Therefore, in fault-tolerant systems it is common to have at least two main memory units and to maintain a copy of the system data simultaneously in both units.

However, maintaining a duplicate copy of data in two separate memories causes a significant reduction in the computational speed of the computer since every data storage operation must be performed twice and such operations are usually supervised by the processing element which cannot simultaneously perform normal processing operations.

In order to reduce the time penalty associated with maintaining duplicate data copies, some prior art fault-tolerant systems maintain only one copy of the data during normal processing operations and, at periodic intervals, update a data copy maintained in a backup memory. This scheme works satisfactorily unless a fault occurs in the main memory which disables portions that contain data which has not yet been copied or unless a fault occurs during the copying operation itself which disables either the main memory or the copy memory so that the copy cannot be completed—such failures can cause loss of data integrity.

It is an object of the present invention to provide a memory backup system in which no single failure can cause a loss of data or data integrity.

It is another object of the present invention to provide a memory backup system in which backup can be carried out quickly and efficiently during a context switch.

It is yet another object of the present invention to provide a memory backup system in which data copying can be carried out without consuming large amounts of processing time thereby slowing processing speed.

It is a further object of the present invention to provide a memory backup system in which the required circuitry to provide complete backup capabilities is minimized.

SUMMARY OF THE INVENTION

The foregoing objects are achieved and the foregoing problems are solved in one illustrative embodiment of the invention in which all data modified under control of a program is temporarily stored only in a non write-through cache memory associated with the processor that is running the program. When a context switch or an overflow situation in which the cache memory becomes full makes it necessary to write the modified data into the system main memory, a special data location in the main memory, containing among other things the identity of the user program currently being executed, is updated to indicate that the data in the cache memory is being written to a first area in main memory associated with the program.

Special circuitry in the processor then writes all of the data which has been modified by the user's program to the first area. At the end of the storage operation, the status block in the main memory is again updated to indicate that the first memory area has been updated and that a second area is about to be updated. Subsequently, the same data is written to the second area. The second storage operation is followed by a final modification of the status block, to indicate that the update of the second area has also been completed.

Therefore, no matter when a fault occurs there remains a consistent set of data in main memory and an associated address at which each user program can be reinitiated. For example, if a processing element fails before it first begins writing modified data blocks to the first memory area, the data and starting address in the first memory area are exactly what they were before the processing element began executing the program and the program can be restarted using the initial data in the first memory area.

Alternatively, if the processing element fails after the writing operation to the first area begins, but before it is completed, the status block in main memory indicates that the writing operation has not been completed and a fault recovery routine need only write the contents of the program's second area in min memory into its first area and cause reexecution of the program on another processing element. Similarly, the computer system can recover from a fault which occurs during modification of the program's second area in main memory by assigning a new second area to the program and recopying the contents of the program's first area into the new second area.

In accordance with the invention, the first and second memory areas are located in physically separate memory elements, therefore, a single memory element failure leaves at least one consistent copy of the program data in main memory except when the copies are being updated. In this case, the system can recover by completing the updating of data in either or both memory areas.

In order to provide reasonable efficiency during program operation while storing all data modified by the program in an associated cache memory, the cache memory must be much larger then that typically used in prior art system. Such a large cache memory can impose significant time penalties during a context switch because in accordance with normal cache operation, each data entry in the cache must be written to the system main memory before a new user program can be installed.

In order to decrease the time required to write the cache contents during context switches, a separate block status memory is associated with each cache memory. The block status memory contains status entries corresponding to each data block in the associated cache memory. Whenever information is written to a data block from a location other than main memory, the associated status entry is modified thus identifying information which has been changed during program operation. Special-purpose hardware is also provided which allows the processing element to write to the system main memory only those data blocks which have been modified and which also have addresses within any specified address range thereby greatly reducing the amount of time required to effect a context switch.

In addition, to further facilitate context switches, special purpose hardware is provided in the processing element that can be activated in parallel with other processing operations and which can be used to invalidate virtual memory address translation map entries during a context switch. Therefore, the supervisor program in the processing element need only issue a command to start the invalidation operation and then proceed to other functions.

DETAILED DESCRIPTION

Figure 1:
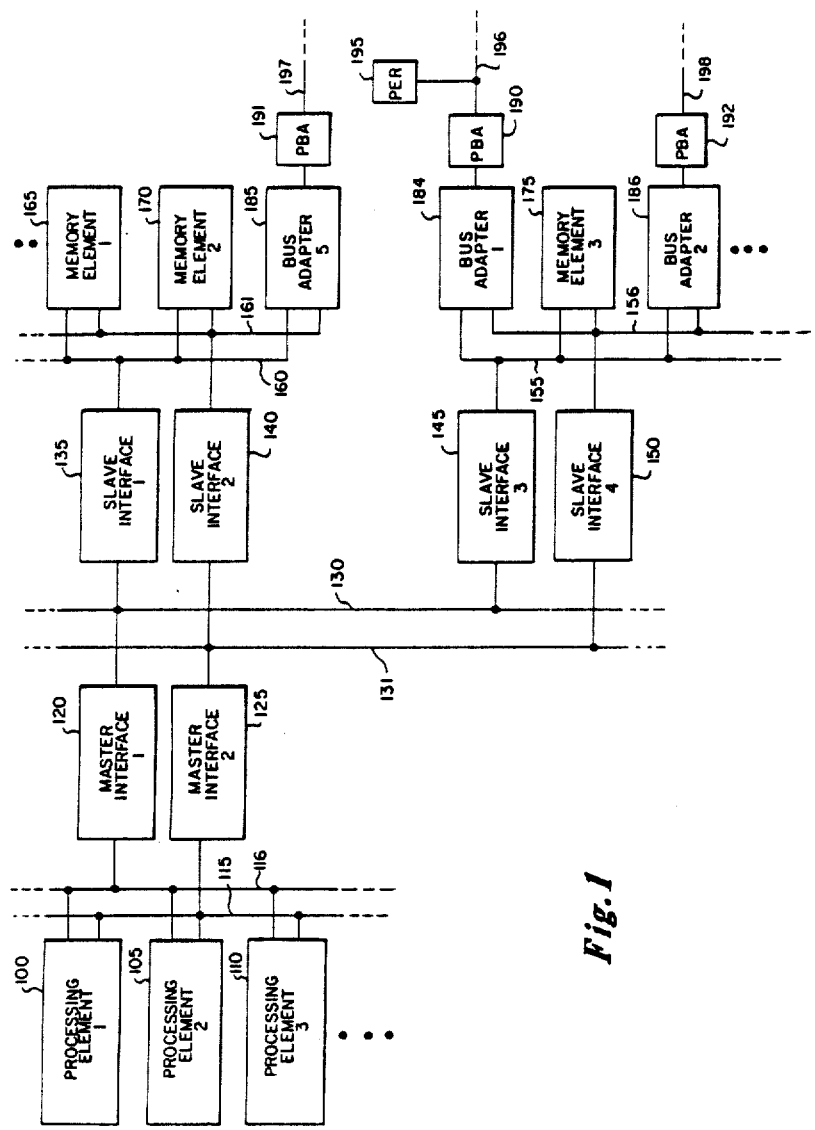
FIG. 1 is a block diagram of an illustrative computer system in which the present invention may be utilized.

As shown in FIG. 1, an illustrative fault-tolerant computer system is comprised of three main elements; processing elements, memory elements and peripheral elements. All of the elements are connected to common system buses 130 and 131. Only one system bus is necessary for system operation, but two buses are preferred to prevent a malfunction in one bus from stopping operation of the entire system and to increase throughput of the system. Similarly, for reliability and speed purposes, the interface units which connect the processing, memory and peripheral elements to the system bus are also duplicated. Buses 130 and 131, although shown as a single line, are actually multi-wire buses comprising many separate data and signal lines as will be described further herein.

Up to sixty-four processing elements (PEs) may be added to the illustrative system of which only three processing elements, 100, 105 and 110, are shown for clarity. Each PE is identical and contains a processor that is a conventional data processing device capable of executing both user application programs and supervisor programs which control and coordinate the operation of the associated processor.

In accordance with the invention, each PE also contains a cache memory that temporarily stores both user and supervisor program code and data. As is typical, the cache memory is used to reduce the effective memory access time. However, as will be explained in more detail below, the cache memory is also used in conjunction with the memory elements to provide a fault-tolerant data backup mechanism which both insures data integrity for any single fault and provides high speed operation.

Also included in each PE is a read-only memory in which is stored additional frequently-used supervisor code and a bootstrap loading program which enables the processing element to become operational when it is reset or upon power-up.

The illustrative computer system also utilizes a virtual memory system in which the address information produced by the processors are translated before being provided to the main memory elements. A table of translations (a map) for translating virtual addresses into physical addresses which are used by the main memory elements is stored in a random-access memory located in each processing element.

All processing elements are connected to redundant processor buses, such as buses 115–116, which are duplicated for reliability purposes and increased throughput. Access to buses 115 and 116 and the system buses 130 and 131 by the PEs is controlled by master interface units 120 and 125, respectively, which are duplicated for reliability and throughput purposes. Each master interface unit contains sequence and control logic and bus arbitration circuitry which can handle up to sixteen processing elements. In order to accommodate additional processing elements, additional processor bus and master interface unit pairs may be added to system buses 130 and 131. Up to a total of four processor bus pairs may be included to the illustrative system to accommodate sixty-four processing elements.

If there are more than 16 processing elements in a particular computer configuration, the processing elements are divided into groups of up to sixteen processing elements. Each group of up to 16 processing elements is connected to a common processor bus, which is, in turn, connected by dedicated master interface units to the system buses.

Within each group of up to sixteen processing elements, supervisory control is shared among the processors. In particular, at any one time a supervisory or "executive" processing element is recognized by all the processing elements in one group and the executive role passes from processing element to processing element in a well-defined priority scheme. The exact mechanism of the transfer of control among processors is disclosed in detail in a copending patent application entitled "Modular Computer System" by Jack J. Stiffler et al. and filed in the United States Patent and Trademark Office on Sept. 3, 1982 and assigned Ser. No. 414,961, now U.S. Pat. No. 4,484,273, which disclosure is hereby incorporated by reference.

All system modules (including memory elements and peripheral units) are assigned uniquely to one processing element group, however, all processing elements can communicate with all memory elements and bus adapters, even those "belonging" to another group. In addition, some common areas in system main memory are recognized by all processing element groups. Within each processing element group, system resources are allocated by the executive processing element as if that group where the only group in the computer system. Communication between groups is accomplished by means of the common memory areas which contain hardware "locks" to facilitate such transfers.

System buses 130 and 131 are connected to memory elements 165-175 and bus adapters 184-186 by means of slave interfaces 135, 140 and 145, 150, respectively. Each slave interface is identical and has a redundant duplicate for reliability purposes and to increase system throughput. More particularly, one slave interface in a pair can be used to provide an access path for transfer of data to or from one memory element or bus adaptor in the associated group while the other slave interface simultaneously provides an access path to a second memory element or bus adapter. Slave interfaces 135-150 contain circuitry which converts the signals produced by memory elements 165-175 and the peripheral buses 196-197 (via peripheral bus adapters 190-192 and bus adapters 184-186) into signals which are compatible with the signals used on system buses 130 and 131.

In particular, slave interfaces 135 and 140 connect system buses 130 and 131 to memory buses 160 and 161. Although only two memory bus pairs, 160, 161 and 155,156, are shown for clarity, up to sixteen dual-redundant memory bus pairs may be added to the illustrative system.

Memory buses 160 and 161 are, in turn, connected to a plurality of memory elements and bus adapters of which three devices (memory elements 165, 170 and bus adapter 185) are shown. These elements together constitute the main memory of the system. In the illustrative embodiment, each of the memory elements contains $2^{21}$ bytes of random access memory and consists of a conventional random access memory unit. Other well-known memory units of different sizes may also be used in a well-known manner.

Slave interfaces 145 and 150 connect system buses 130 and 131 to memory buses 155 and 156 which are identical to buses 160 and 161. Peripheral buses 196 and 198 are coupled to buses 155 and 156 by interface circuitry consisting of bus adaptors of which two adaptors, 184 and 186, are shown and peripheral bus adapters of which units 190 and 192 are shown. Each bus adaptor contains buffer memories and data processing logic which can buffer and format data information received over the memory buses and the peripheral buses and commands received from the processing elements via the system buses. In particular, each bus adaptor can handle signals on two independent command channels and two independent input/output data and command channels.

Each bus adaptor, such as adaptor 184, is connected to a peripheral bus adaptor 190 over a dedicated bus. The peripheral bus adapters contain a microprocessor and an associated program memory. Under control of a program stored in the program memory, the microprocessor unit can perform format conversions and buffering for information passing between the processing elements and the peripheral controllers and units. The formatting functions performed by the peripheral bus adaptor units help to speed up overall processing time by relieving the processing elements (PEs) of some routine data transfer tasks. Each peripheral bus adaptor can be individually programmed to provide an interface to a variety of standard peripheral buses onto which in the illustrative embodiment can be attached input/output controllers of various types, including secondary storage devices such as disks and tapes. Peripheral bus adaptors 190-192 can be programmed to convert between the signals used on internal memory buses 155 and 156 and the signals used to the peripheral buses 196-198 and, therefore, allow many different peripheral bus formats to be used with the illustrative system.

When a memory element or bus adaptor is inserted into the system, it undergoes an initial power-up clear and initialization cycle during which all of its bus drivers are turned off to prevent the unit from communicating erroneous information to the system. In addition, the unit's internal status registers are set to a predetermined state. After initialization has been completed the unit sends an interrupt to the current executive processing element thereby informing the executive processing element that it is available.

In response to this interrupt, the executive processor initializes the newly inserted unit by testing the unit to verify that its internal fault monitoring apparatus is operational and records its existence in appropriate memory tables.

If the unit is a memory element (determined by reading its status) it is assigned a physical name, thus defining the physical addresses to which it is to respond. Alternatively, if the unit is a bus adapter/peripheral bus adapter, a program is loaded into its internal program memory which program allows its internal microprocessor to query the associated peripheral devices in order to determine the number and type of peripheral units on the associated peripheral bus. Peripheral information is reported back to the executive processing element via the interrupt mechanism which thereupon responds by loading the appropriate operating programs into the program memory in the newly inserted unit and again updating system configuration tables in memory.

Figure 2:
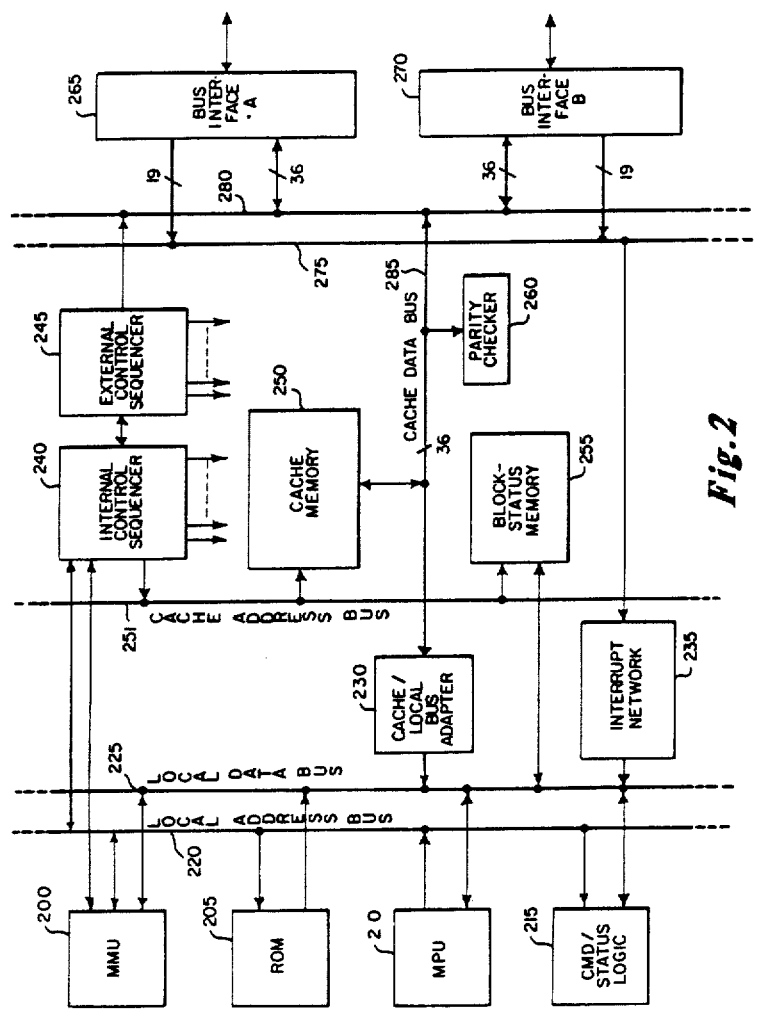
FIG. 2 is an expanded block diagram of the processing element shown in FIG. 1 incorporating the illustrative cache and block status memories.

A more detailed functional block diagram of a processing element is shown in FIG. 2. Each processing element contains identical circuitry and therefore the circuitry in only one processing element will be discussed in detail to avoid unnecessary repetition. The heart of the processing element is a microprocessor unit (MPU) 210 which performs most of the ordinary calculations handled by the computer system. Microprocessor unit 210 may illustratively be a conventional 16-bit microprocessor. Several microprocessor units with suitable characteristics are available commercially; a unit suitable for use with the illustrative embodiment is a model MC68000 microprocessor available from the Motorola Semiconductor Products Company, Phoenix, Arizona.

Supporting the operation of MPU 210 are several other units which assist the MPU to decrease its processing time and decrease the effective memory access time. In particular, these units include memory management unit 200, ROM 205 and cache memory 250.

In particular, MPU 210 operates with a "virtual address" arrangement. In this well-known memory arrangement, MPU 210 produces "virtual" addresses which require a translation in order to convert them into the actual addresses which correspond to memory locations in the computer system main memory. The translation of virtual addresses to physical addresses is accomplished by memory management unit 200. Unit 200 utilizes a translation "table" or "map" retrieved from main memory during a context switch and stored in an internal random access memory to perform the translation from virtual to physical addresses. Specifically, virtual address information produced by MPU 210 is provided to memory management unit 200 via local address bus 220. Memory management unit 200 translates the virtual address information into physical addresses used for addressing the main memory in the computer system. The translated information is provided to cache/local bus adapter 230 which controls the flow of information inside the processing element and gates the appropriate translated cache address onto cache data bus 285.

During a context switch the entries in the translation map must be invalidated to prevent improper operation. In accordance with one aspect of the invention, to decrease the time required to perform a context switch, special purpose hardware is provided in the processing element which can be activated in parallel with other processing operations. The special purpose hardware automatically invalidates all map entries during a context switch. Therefore, the supervisor program in the processing element need only issue a command to start the invalidation operation and then proceed to other functions.

Cache memory 250 is a well-known memory element which is used to decrease the effective memory access time and, in accordance with the invention, to provide a memory backup arrangement. In particular, a sub-set of the information stored in the main memory is also temporarily stored in cache memory 250. Memory 250 responds directly to virtual addresses supplied by microprocessor unit 210 and, if the requested information is present in the cache memory (called a "cache hit"), the information becomes available in a much shorter time interval than a normal access to main system memory would require. If the requested information is not present in the cache memory but is present in main memory, the attempted access is called a "cache miss" and well-known circuitry automatically transfers or "writes" a parcel of information called a "block" containing the requested information from main memory into the cache memory. If the requested information is located only in peripheral secondary storage the access attempt results in a "page fault" which is handled via procedures to be hereinafter described.

Cache memory 250 consists of a $2^{17}$ byte random access memory arranged in a 36 bit by 32,000 word (actually 32×1024 word) configuration (each 36-bit word contains 4 information bytes each associated with a parity bit). Information retrieved from cache memory 250 is provided, via cache data bus 285 and cache/local bus adapter 230 to local data bus 225 and thence to MPU 210. Cache/local bus adapter 230 provides interface and signal conversion circuitry between 32-information-bit cache bus 285 and 16-information-bit local data bus 225. In addition, bus adapter 230 checks byte parity on data passing from cache memory 250 to local bus 225 and generates byte parity information for data flowing in the opposite direction.

In accordance with the invention cache memory 250 is a non-write through cache memory. Most conventional cache memories are write-through memories; that is, when information is written into a conventional cache memory, the same information is also immediately written into the copy of the data maintained in the system main memory. Write-through operation allows a consistent copy of data to be maintained in one location. Unfortunately, if a fault occurs before processing is finished, the only data copy may have become modified during processing so that it is impossible to restart processing on the original data. Contrary to conventional operation, the inventive cache memory is non writethrough so that modified data is written only in the cache memory during processing. Therefore, if a fault occurs during processing, the original data in main memory remains intact so that processing can be restarted on the original data.

In particular, when a context switch or an overflow situation in which cache memory 250 becomes full makes it necessary to write the modified data into the system main memory, a special data location in the main memory, containing among other things the identity of the user program currently being executed, is updated to indicate that the data in cache memory 250 is being written into a first area in main memory associated with the program.

Special circuitry, which will hereinafter be described in detail, in the processing element then writes all of the data in cache memory 250 which has been modified by the user's program to the first area. At the end of the writing operation, the status block in the main memory is again updated to indicate that the first memory area has been updated and that a second area is about to be updated. Subsequently, the same data is written into the second area. The second storage operation is followed by a final modification of the status block to indicate that the update of the second area has also been completed.

Therefore, no matter when a fault occurs there remains a consistent set of data in main memory and an associated address at which each user program can be reinitiated. For example, if a processing element fails before it first begins writing modified data blocks to the first memory area, the data and starting address in the first memory area are exactly what they were before the processing element began executing the program and the data processing task can be restarted using the initial data in the first memory area.

Alternatively, if the processing element fails before the writing operation to the first area is complete, the status block in main memory indicates that the writing operation has not been completed and a fault recovery routine need only write the contents of the program's second area in main memory into its first area and cause reexecution of the program on another processing element. Similarly, the computer system can recover from a fault which occurs during modification of the program's second area in main memory by assigning a new second area to the program and recopying the contents of the program's first area into the new second area.

In accordance with the invention, the first and second main memory areas are located in physically separate memory elements, therefore, a single memory element failure leaves at least one consistent copy of the program data in main memory except when the copies are being updated. In this case, the system can recover as described above by completing the updating of data in either or both memory areas.

In order to provide reasonable efficiency during program operation while storing all data modified by the program in an associated cache memory, the cache memory must be much larger then that typically used in prior art system. Such a large cache memory can impose significant time penalties during a context switch because in accordance with normal cache operation, each data entry in the cache must be stored in the system main memory before a new user program can be installed.

In accordance with another aspect of the invention, special purpose circuitry is also provided which stores only those data entries in cache memory 250 which have been modified during program operation.

More particularly, associated with cache memory 250 is block status memory 255. Memory 255 contains a plurality of entries, each of which contains information regarding one block (128-byte segment) of data stored in cache memory 250. Specifically, each entry in block status memory 255 contains a "label" which identifies the virtual address, if any, currently mapped into the associated cache block (virtual address information is received from cache address bus 251). In addition, each entry in block status memory 255 contains a "valid" bit which indicates whether the contents of the associated block are valid in the present context (associated with the program presently running in MPU 210) and, each entry also contains a "dirty" bit which indicates whether the contents of the associated block, if valid, have been altered since the contents were initially loaded into the associated cache memory block.

In accordance with another aspect of the invention, the valid and dirty bits stored in block status memory 255 are used by special circuitry which, upon a context switch, stores to main memory the contents of only those blocks identified as "dirty" by the block status memory, thereby effecting a savings in the amount of time necessary to perform a context switch. Block status memory 255 may also be used for controlling the automatic clearing of cache memory 250 during context switches.

Cache memory 250 may receive address information over cache address bus 251 and data information, via bus interfaces 265 and 270, from the processor buses in order to update information in memory 250 from the system main memories. More specifically, interfaces 265 and 270 connect the processing element to the processor buses and each accommodate 19 interrupt lines (including 15 information bits and 4 parity bits) and 36 address/data lines (which consist of 32 information bit lines and 4 parity bits). Miscellaneous control lines (not shown) also pass through interfaces 265 and 270 to control the operation of the processing element.

The byte parity of information passing from data bus 280, via cache data bus 285, to cache memory 250 is checked by parity checker 260 which consists of well-known parity checking circuitry that provides error detection for information transferred from the computer system main memory to cache memory 250.

Data transfers which occur between the processing element and the processor bus via interfaces 265 and 270 are controlled by the external control sequencer 245. As will be hereinafter discussed in more detail, sequencer 245 receives synchronization signals from internal control sequencer 240 and controls data transfers by gating the appropriate addresses onto bus 280, generating control signals and coordinating the transfer of data between cache memory 250 and the processor bus.

Read-only memory 205 is also connected to the local address and data buses 220 and 225, respectively, and contains program instructions that can be accessed by MPU 210. In particular, ROM 205 contains a "bootstrap" program which is used to restart the processing element after initial system power-on or after a system reset. In order to increase the processing speed of MPU 210, ROM 205 also contains other frequently-used operating system routines which may be accessed by MPU 210 over local data bus 225.

In addition to receiving and transmitting data signals via bus 280, interfaces 265 and 270 may also receive interrupt signals and gate them onto over 19-bit interrupt bus 275. Incoming interrupt signals are provided to interrupt network 235 which gates the interrupt data received over interrupt bus 275 onto local data bus 225 where the data can be read by MPU 210. Interrupt data received over interrupt bus 275 consists of an 8-bit identification code indicating the source of the interrupt, a 3-bit level code indicating the level of the interrupt and a 4-bit interrupt vector which indicates the memory location at which the desired interrupt routine begins. In addition, 4 parity bits are included to detect errors in the remaining 15 information bits on the 19-bit interrupt bus.

Figure 3:
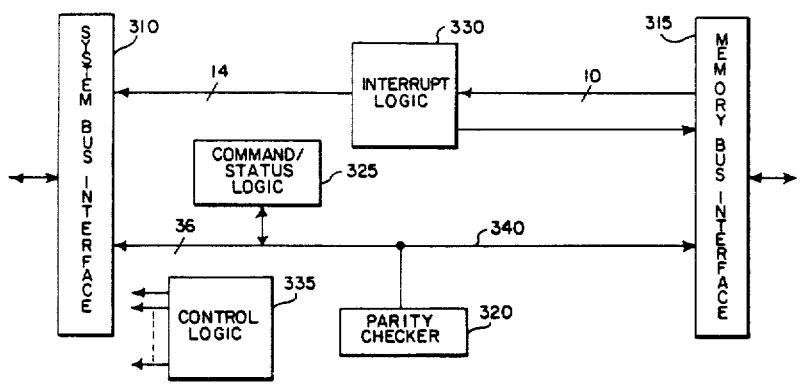
FIG. 3 of the drawing shows an expanded block diagram of the slave interface shown in FIG. 1.

FIG. 3 shows a functional block diagram of the slave interface unit of the illustrative fault-tolerant computer system. The slave unit is connected to the system bus by bus interface 310 and to the associated memory bus by bus interface 315. System bus interface 310 provides filtering and buffering for 36 address/data lines and associated control lines and 14 interrupt lines.

Similarly, memory bus interface 315 provides filtering and buffering for 10 interrupt lines (consisting of 2 interrupt level bits, 4 interrupt source identification code bits and 4 parity bits) and 36 address/data lines (32 information bits and 4 byte parity bits) and some associated control lines for transferring information from the slave interface to the memory bus and ultimately to the memory elements or bus adapter units. Information on 36-bit internal data bus 340 is provided to a parity circuit checker 20 which checks byte parity on received addresses and data. Information is also provided to command/status logic 325 which decodes incoming information and recognizes selected commands that are used for diagnostic purposes and stores status conditions that are used to indicate failure conditions to the processing elements.

The 10 interrupt lines which pass through memory bus interface 315 and the 14 interrupt lines which pass through system bus interface 310 are provided to interrupt logic 330. Interrupt logic 330 contains well-known circuitry which generates a "polling" sequence that is used to determine if any of the associated memory elements or bus adapters are generating an interrupt signal to request service. In particular, each memory element or bus adapter is "polled" or examined in a predetermined sequence to detect an interrupt. The slave interfaces are, in turn "polled" by interrupt circuitry (to be described in detail below) in the master interface. Any interrupt detected by the slave interfaces is relayed to the master interface unit over the system bus via bus interface 310 in response to a polling signal received from a master interface.

The operation of the entire slave interface is controlled and synchronized by control logic 335 which contains well-known clocking and sequence generating circuitry to provide synchronization signals to the remaining circuitry in the unit.

Figure 4:
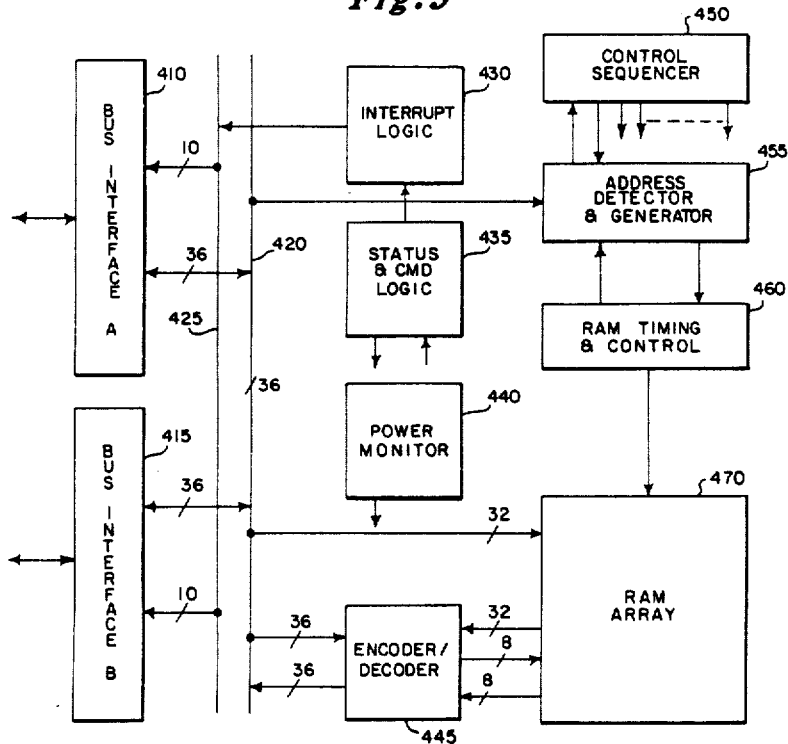
FIG. 4 of the drawing shows an expanded block diagram of the memory element shown in FIG. 1.

A more detailed functional block diagram of a memory element is shown in FIG. 4. All memory elements contain identical circuitry and only one will be discussed in detail for clarity. Each memory element is connected to both redundant memory buses by means of interfaces 410 and 415. Each interface circuit contains circuitry which filters and buffers 10 interrupt lines (6 information bits and 4 parity bits), 36 address-/data lines (32 information bits and 4 byte parity bits) and several associated control lines.

Incoming address information is passed by interfaces 410 and 415 to internal address bus 420 where the information is provided to address detector and generator circuit 455. Circuit 455 decodes and detects addresses to which the associated memory element is programmed to respond. In addition, in accordance with well-known principles, it generates a sequence of address information which is needed to access a block (128 bytes) of data stored in random access memory (RAM) array 470. The information produced by circuit 455 is provided to RAM timing and control circuit 460. This circuit also contains well-known circuitry which generates the timing signals (row and column address strobes) and the control signals (chip selects) which are used to control RAM array 470. In addition, RAM timing circuit 460 contains circuitry to drive the address leads (the row and column addresses) needed to access information in RAM array 470 and to provide periodic "refresh" signals in order to prevent information loss in array 470.

RAM array 470 contains 320 64K dynamic random access memory devices. These devices are conventional, commercially-available memory devices available from a number of semiconductor manufacturers. Array 470 is organized into an 8 row by 40 column array ($2^{19}$ 32-bit word, 8 parity-bit rows). In response to timing control signals produced by circuit 460 and address signals provided via internal address bus 420, RAM array 470 provides stored information and associated stored parity check bits to encoder/decoder 445. Circuit 445 accepts the 40-bit encoded information retreived from RAM array 470 and uses the 8-bit parity information code to identify and correct ay single bit error in accordance with well-known error correction techniques. Also, in accordance with well-known error detection techniques the 8-bit error correcting code is used to detect all double and most multiple bit errors. Status flags are set by circuit 445 to indicate that an error has occurred. Encoder/decoder circuit 445 is also used to generate byte parity bits which are sent along with all retrieved information that is either correct or has been corrected by the error correction circuitry. The 32-bit information word retrieved from RAM array 470 (and possibly corrected) is provided, along with 4 parity bits, to the 36-bit internal data bus 420 and, via interfaces 410 and 415, to the memory bus and to the other units in the computer system.

Several additional circuits are used to service the memory circuitry including interrupt logic 430, status and command logic 435, power monitor circuit 440 and control sequencer 450. Control sequencer 450 generates control and synchronization signals which are used to sequence the memory element through its various operations. These sequence signals are generated in a standard fashion.

Power monitor circuit 440 monitors the system power supply and generates a "clear" or reset signal when power is first applied to the memory element. In addition, power monitor circuit 440 also detects a condition in which only stand-by power is available so that the memory element can go into a refresh-only mode thereby reducing power consumption yet maintaining the stored information intact.

Status and command logic 435 stores status information (for example, fault conditions and the address being accessed at the time of a fault, etc.) for external access by the processing elements during a fault condition. Circuit 435 also accepts commands from the processing elements, which commands are used to set up diagnostic tests and other diagnostic functions.

Interrupt logic 430 initiates interrupts to the slave interface in the event of a fault in the memory element and on initial power up of the memory element to indicate that the memory unit is available and operational when it is reset or upon power-up.

Although each processing element contains identical circuitry, each processing element is assigned a unique six-bit identification number which is determined by the electrical wiring of the connector slot into which the processing element module is inserted. The identification number is used to identify each processing element to its associated master interface for control transfer and bus access operations as will be hereinafter described.

Figure 5:
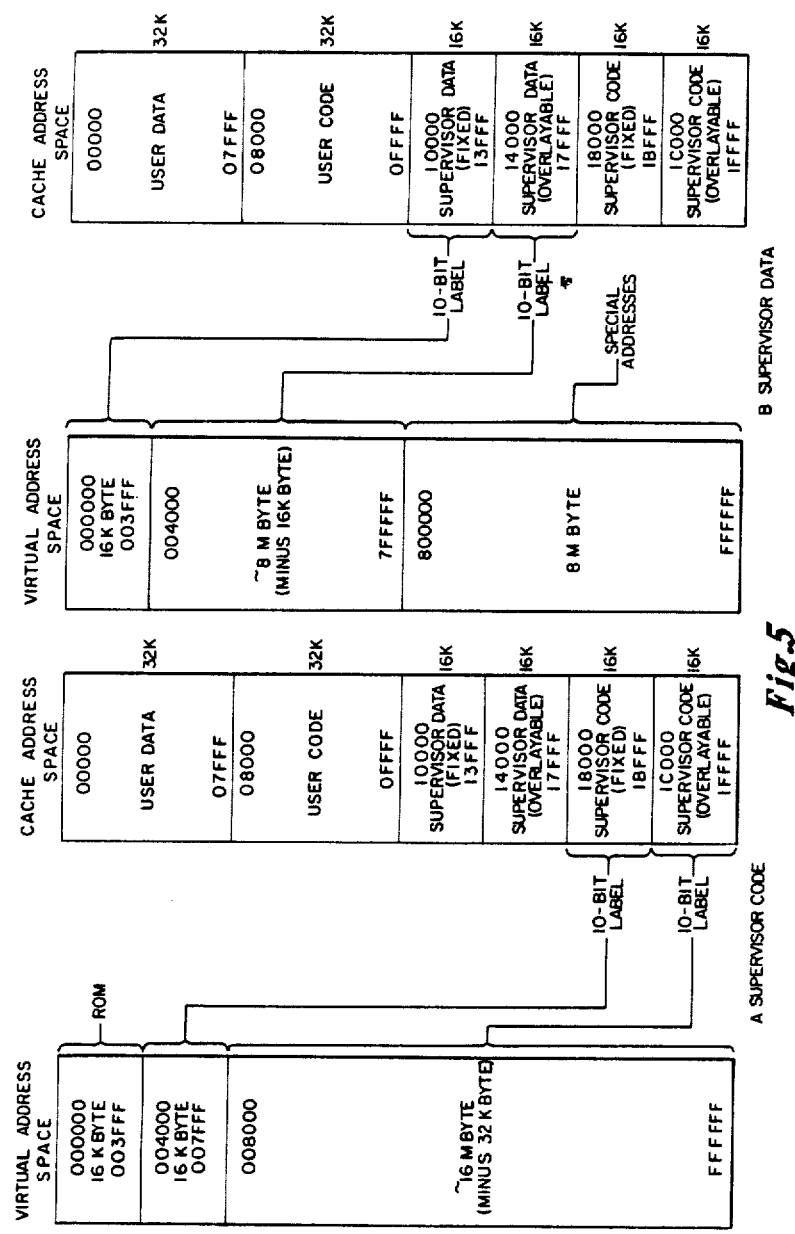
FIG. 5 of the drawing shows the division of the cache memory into supervisor and user code and data spaces and the mapping of the supervisor code and supervisor data spaces into their respective locations in the cache memory.
Figure 6:
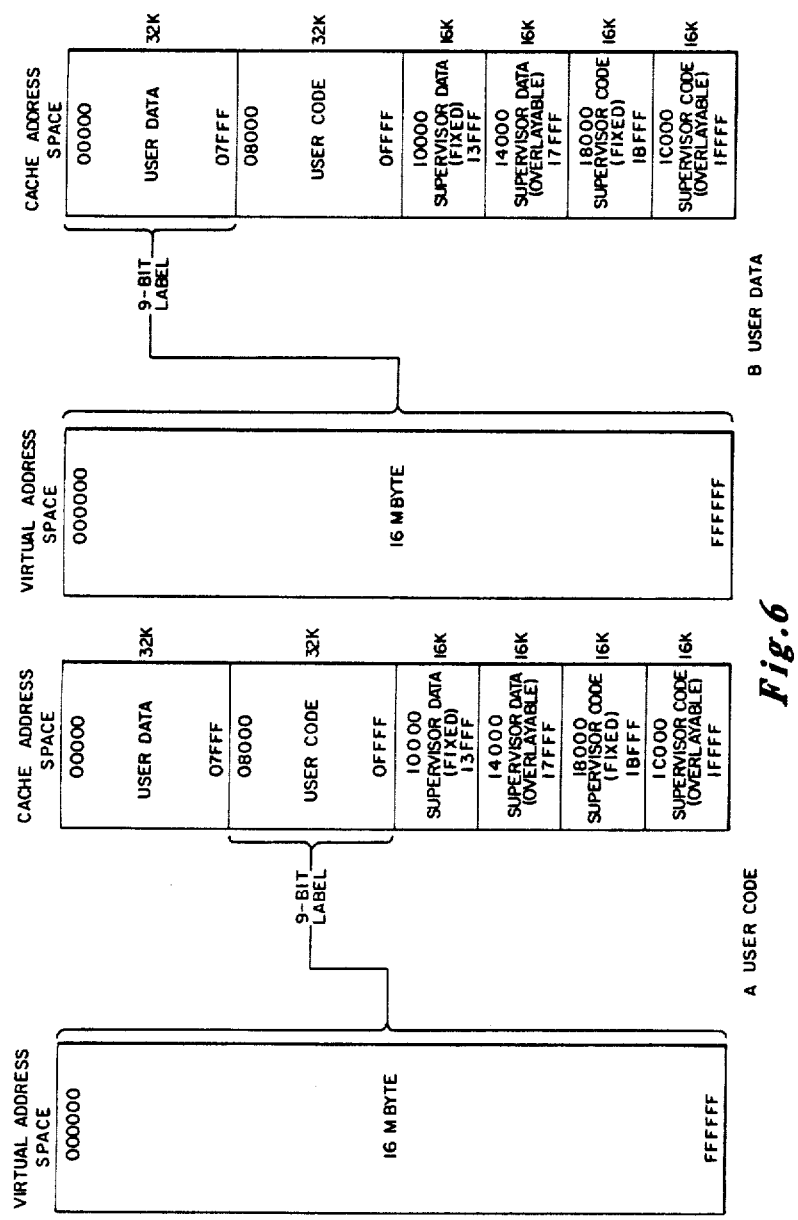
FIG. 6 of the drawing shows the mapping of the user data and user code spaces into their respective locations in the cache memory.

The cache memory and the circuitry which controls it and performs the various moving and storing routines will now be described in detail. In particular, FIGS. 5 and 6 show the allocation of the cache memory space among the supervisor and user programs which utilize the memory. In the illustrative embodiment, cache memory (memory 250 in FIG. 2) consists of a high-speed random access memory which has 128 kilobytes of memory. The entire memory can be uniquely accessed by a 14-bit address code corresponding to addresses 00000-1FFFF (in hexidecimal notation). The total 128 Kbytes of memory are divided between supervisor programs and the user programs which operate with the cache memory. The division of the memory space between supervisor and user programs is predetermined and fixed.

More particularly, one half of the memory corresponding to the first 64 Kbytes of memory space(corresponding to address codes 00000-0FFFF) is permanently assigned for use by user programs only. Similarly, the remaining 64 Kbytes of memory (corresponding to address codes 10000-1FFFF) are permanently assigned for use by the supervisor program running in the associated microprocessor.

Of the 64 Kbytes assigned to user programs, the first 32 Kbytes (corresponding to address codes 00000-07FFF) are assigned permanently for storage of user program data. The next 32 Kbytes of memory (corresponding to addresses 08000-0FFFF) are permanently assigned for use in storing user program code.

A similar division (32 Kbytes each) is made for supervisor data and code. However, both the supervisor code and data areas are further divided into two 16-Kbyte areas. In one 16-Kbyte area selected supervisor program code which is frequently utilized is permanently stored. In the other 16-Kbyte area of supervisor program code is stored changeable or "overlayable" code, the contents of which can be changed during program operation to provide flexibility.

The supervisor data storage area also consisting of 32-Kbytes of memory is likewise divided into two 16-Kbytes sections (addresses 18000–1BFFF and 1C000–1FFFF, respectively). As with the supervisor code, the supervisor data area is divided into fixed and overlayable sections.

In the illustrative embodiment, the microprocessor unit is capable of generating 24-bit addresses (A0–A23) and is therefore capable of individually addressing approximately 16 megabytes of information corresponding to addresses 000000–FFFFFF (in hexadecimal notation). In addition to producing address codes, such a microprocessor can also provide three function code signals (FC0–FC2) which specify whether the address code signals produced by the microprocessor are directed user data, user code, supervisor data or supervisor code. The function code states corresponding to user data, user code and supervisor code spaces are FC2−FC0=001, 010, and 110, respectively. For supervisor data, FC2−FC0=101 and, in addition, address bit A23 is used to distinguish between two types of addresses; memory addresses and special addresses. Special addresses are used, as will be hereinafter described, during special cache memory control operations.

Since, the 24-bit address codes produced by the microprocessor can be used to address a total of 16 Mbytes of data, and since the cache memory has only a total of 128 Kbytes of memory, some means must be used to translate or "map" from the address produced by the microprocessor into cache memory space. In particular, in the illustrative embodiment a block status memory is associated with the cache memory. The block status memory contains a memory location for each 128 byte block of information in the cache memory. When a cache memory block is loaded from main memory, a portion of the 24-bit virtual address is applied to the cache memory to select a location in which to write data. The remainder of the address (the "label") is stored in the corresponding location in the block status memory. Later during an MPU access, this portion of the microprocessor-generated virtual address is compared to the stored label associated with the accessed block. A match indicates that the stored data is valid for the program running in the microprocessor.

FIG. 5A shows the correspondence of the virtual memory space to the cache memory space for supervisor program code. The total cache memory address space and its allocation among supervisor and user programs is shown schematically in the block at the right-hand side of the Figure. In the block at the left side is shown the configuration of the total virtual address space for supervisor program code.

In particular, out of the approximately 16 megabytes of virtual memory space capable of being addressed by 24 address bits, the first 16 Kbytes (corresponding to addresses 000000–003FFF) are assigned to locations in the read-only memory unit associated with the microprocessor (the read-only memory is designated as 205 in FIG. 2). As previously described, information stored in the read-only memory 205 is used for system start-up and diagnostic programs.

The next 16 Kbytes of virtual address space are assigned to supervisor program which is permanently stored in the cache memory and (corresponding to addresses 004000–007FFF) and translate on a one-to-one basis to a 16 Kbyte section of cache memory space corresponding to addresses 18000–1BFFF. Only 14 bits (bits 0–13) are needed to specify each location in the 16 Kbyte cache memory section and the remaining 10 bits (bits 14–23) are designated as the "label" and stored in the block status memory. Since the translation between virtual addresses and fixed supervisor code is one-to-one, the 10 bit label is fixed (bit 14=1 and bits 15–23=0).

The remainder of the virtual address space consisting of approximately 16 megabytes (the entire virtual address space minus the 32 Kbytes already allocated to ROM and fixed supervisor code) corresponding to addresses 008000–FFFFFFF maps into the remaining 16 Kbyte supervisor code section of cache memory consisting of addresses 1C000–1FFFF. As with the fixed supervisor code, the lower 14 bits of the virtual address space specify a location in cache memory. The remaining 10 bits (bits 14–23) are stored as a label in the associated location in the block status memory.

FIG. 5B shows the mapping of the virtual addresses for supervisor data into the cache memory. The lower 16 Kbytes (consisting of addresses 000000–0003FFF) are mapped on a one-to-one basis into a fixed supervisor data area of 16 Kbytes (consisting of addresses 10000–13FFF). The next supervisor data space is an overlayable space consisting of approximately 8 megabytes (8 megabytes minus 16 Kbytes) starting at address 004000 and continuing to address 7FFFFF. This space maps into a 16 Kbyte overlayable supervisor data space in cache memory consisting of addresses 14000–17FFF. The remaining 10 bits are stored, as with the supervisor code, in the block status memory and used for matching purposes upon access.

The remaining 8 megabytes of supervisor data virtual address space consisting of addresses 800000–FFFFFF are used for special addresses during cache memory control operations as will be hereinafter described in detail.

FIG. 6 shows the allocation of the virtual address space for user code and user data. As shown in FIG. 6A, the entire virtual address space consisting of 16 megabytes (addresses 000000–FFFFFF) translates into a 32 Kbyte user code area located at addresses 08000–0FFFF in the cache memory. Fifteen bits (0–14) are required to uniquely address the 32 Kbyte cache memory space and the remaining bits (15–23) are stored as a 9-bit label in the block status memory and used in a similar fashion to the supervisor code and data labels to check for valid data.

As shown in FIG. 6B, the entire 16 megabyte space for user data is also mapped into a 32 Kbyte cache memory space starting at address 00000 and continuing to address 07FFF. As with the user code, a 9-bit label is stored in the block status memory.

Figure 7:
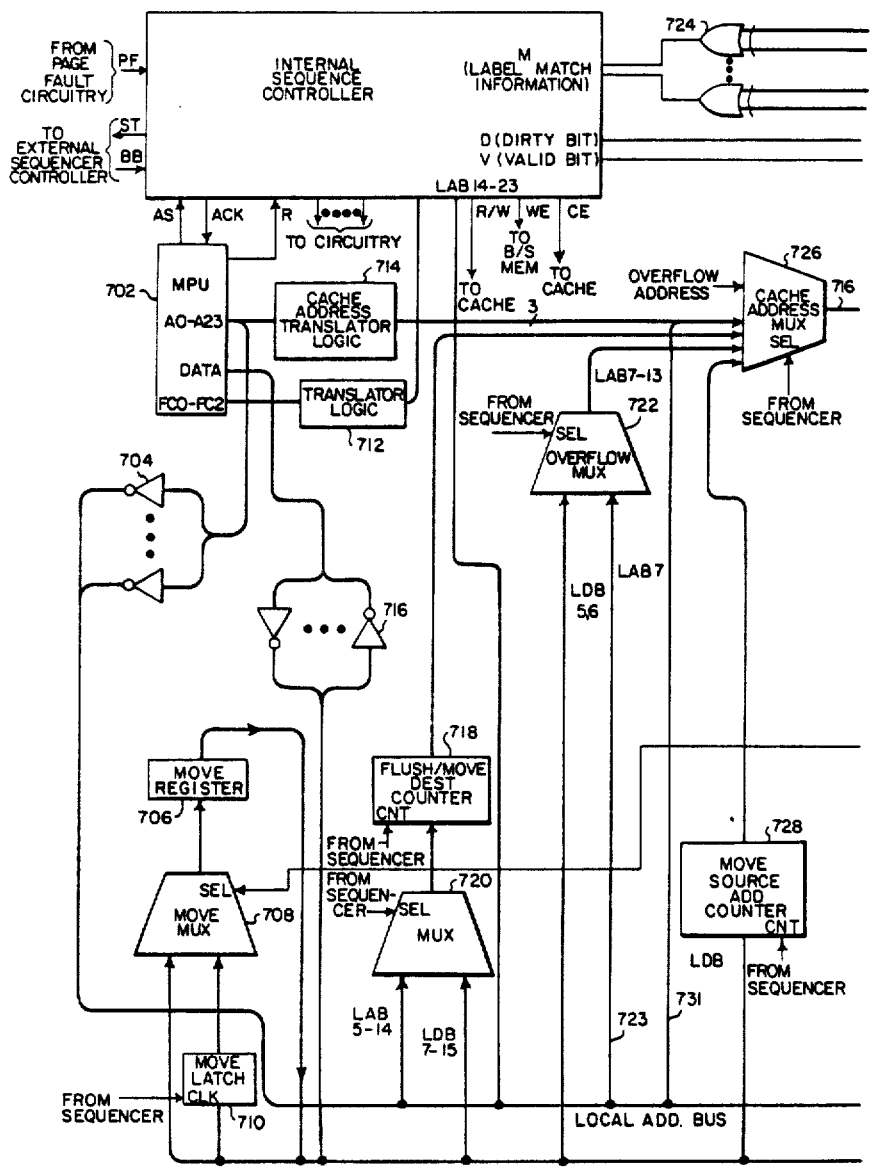
FIG. 7 of the drawing, consisting of two drawing sheets, shows a detailed block diagram of circuitry used to operate the cache and block status memories in the processing element.
Figure 7:
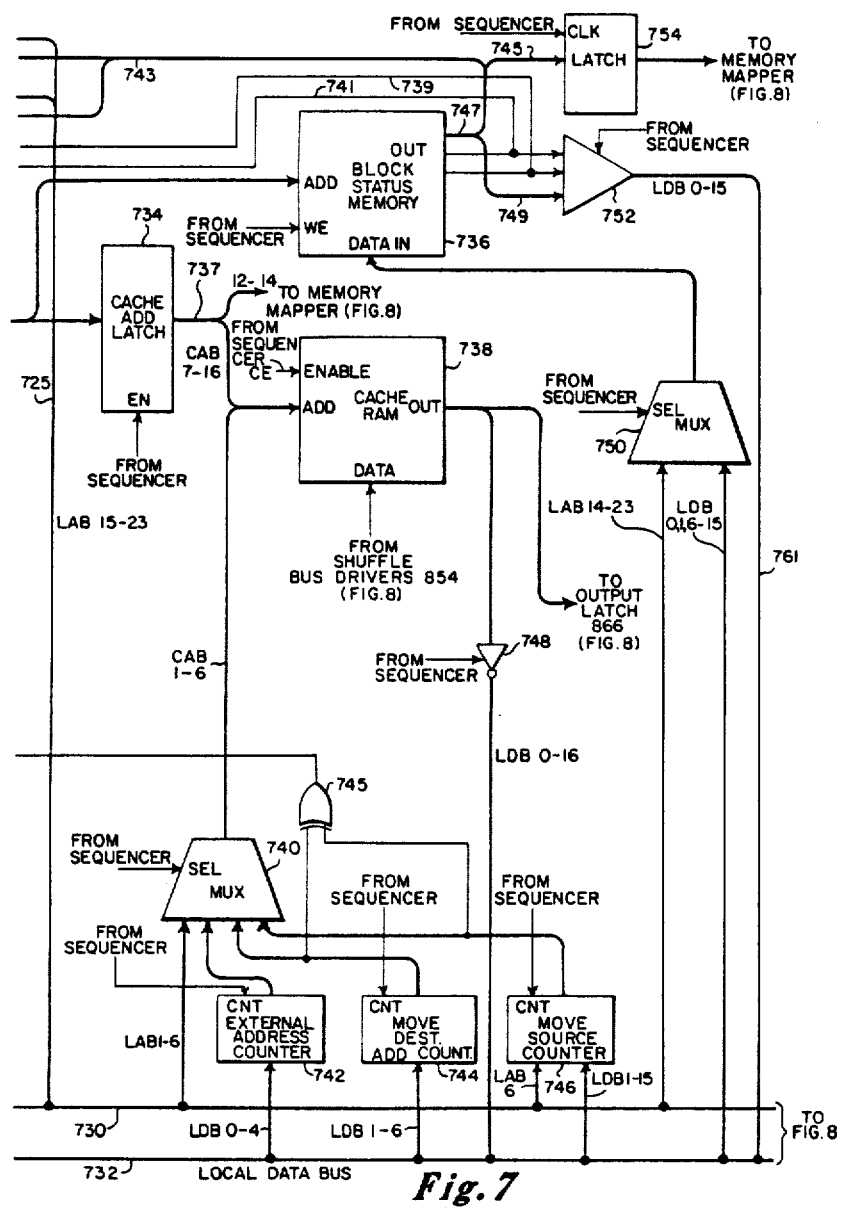
Figure 8:
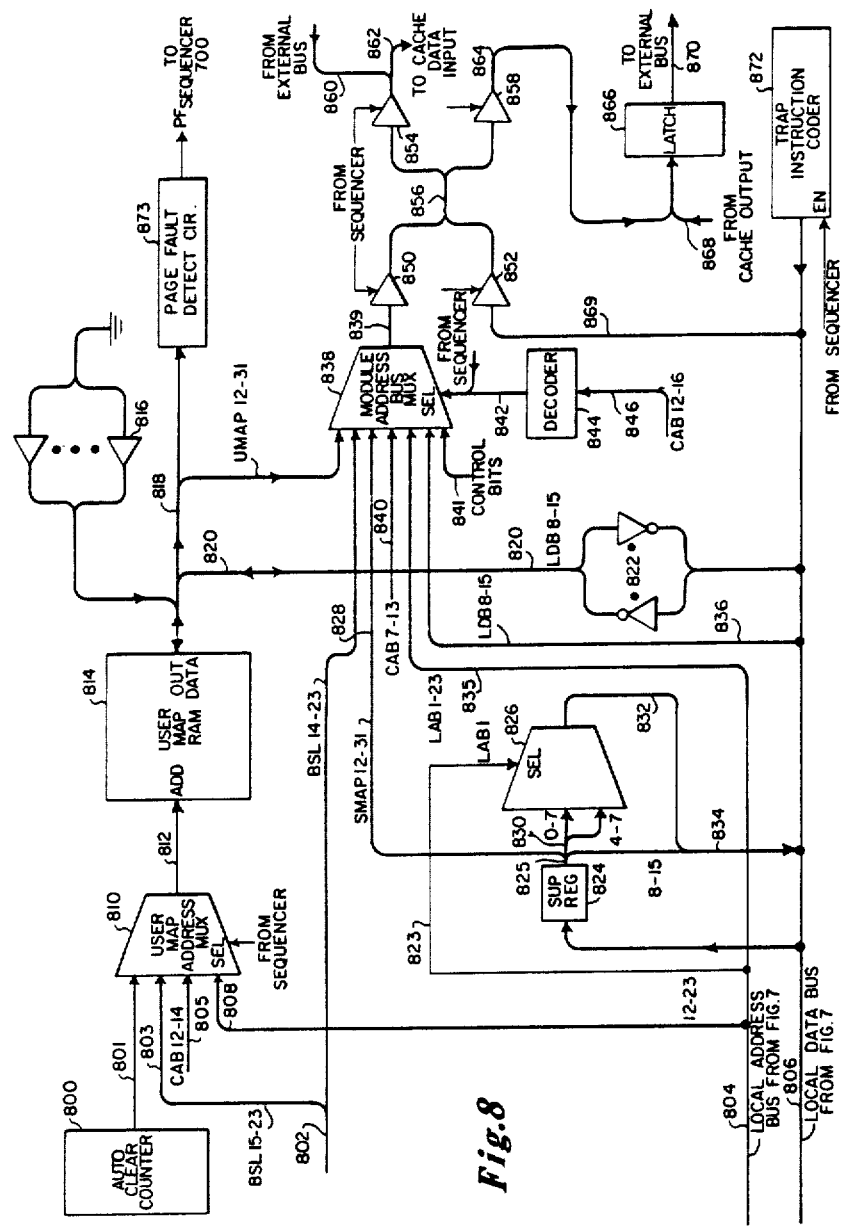
FIG. 8 of the drawing shows an expanded block diagram of the memory management circuitry in the illustrative embodiment.

The operation of the cache memory and its associated support circuitry will be described in detail in connection with FIGS. 7 and 8. In particular, FIG. 7 shows a block schematic diagram of the support circuitry associated with the operation of the block status memory and the cache memory. FIG. 8 shows a detailed block diagram of the circuitry used to read information from the system main memory in the case that the requested information is not present in the cache memory. The detailed construction of many of the circuit blocks is not shown in detail for clarity; however, the multiplexer and latch circuitry is standard in design and construction and its operation is well-known to those skilled in the art.

Referring to FIG. 7, the cache control circuitry includes an internal sequencer controller 700 which produces control signals that coordinate and synchronize the operation of the various portions of the cache memory and its support circuitry. The detailed construction of internal sequencer controller 700 is also not shown for clarity. It can be constructed using either standard discrete logic circuitry, customized array logic or read-only memories in accordance with the state tables given below. In particular, since it is advantageous for the sequence controller to respond quickly to access commands from MPU 702 when it is in an "idle" state the circuitry which is used to process signals from MPU 702 which are generated while the sequencer is in its idle state is preferably high-speed discrete or customized array logic circuitry. The remainder of the sequencer state may implemented using read-only memories.

Sequencer 700 receives a number of signals from MPU 702 indicating the type of operation requested by MPU 702. Specifically, MPU 702 produces a set of address signals on its 24 address leads A0–A23 (more specifically, MPU 702 does not generate an address signal A0, but instead MPU 702 generates two data strobe signals, UDS and LDS, which are used to control the reception of data in the various circuits). When a valid address is present on leads A0–A23 MPU 702 asserts the address strobe lead AS. In the following description a reference to a signal (for example, AS) indicates that the signal is being asserted; the presence of an asterisk following a signal name (for example, AS*) indicates that the signal is negated or not asserted.

MPU 702 also produces three function code signals FC0–FC2 as described above and a read/write signal, R, which signal designates whether the present operation is a read operation or a write operation.

In addition, sequencer 700 interacts with an external control sequencer (not shown). The external sequencer controls the flow of information between the processing element and the remainder of the computer system over the processor busses. The design and construction of such a sequencer are straightforward and will not be described in detail herein. During its operation, the external sequencer steps the processor bus control circuitry through a fixed series of operations in which the processor bus drivers are controlled to gate information between the processor bus and the remainder of the computer system. Received information is then formatted, checked for errors and forwarded to the internal data bus in the processing element. The operation of the external sequencer (or bus transfer machine) is started by sequencer 700 when it asserts the start lead (ST). While the external sequencer is operating, it returns a busy signal (BB) to sequencer 700. After the requested data transfer operation has been completed, the busy signal is negated (BB*).

In the course of its operation, sequence controller 700 produces a number of signals which are used to control the various circuit blocks shown in FIG. 7 and also inform MPU 702 of the status of the requested operation. In particular, sequence controller 700 produces an acknowledge signal (ACK) which, when asserted, indicates to MPU 702 that the requested operation has either been initiated or completed as will be hereinafter described below. Other outputs (CE, R/W, WE) produced by internal sequence controller 700 are used to enable both cache memory 738 and block status memory 736, and control their read and write cycles. Still further outputs are used to switch various multiplexers to transfer information among circuit blocks as will be hereinafter described in detail.

Under control of sequencer 700, each processing element can be in one of eight well-defined states. During each of these states a specific operation or routine is carried out by the processing element circuitry. Each sequencer state is designated by a one letter mnemonic code and consists of one or more substates each of which occurs generally during each clock pulse of the system clock.

The first of the eight states is the idle state (identified by the mnemonic code "I"). Internal state sequencer 700 remains in the idle state until it receives an access request from MPU 702. While in the idle state sequencer 700 monitors an address strobe lead (designated as lead AS) for address strobe signals generated by MPU 702 indicating that MPU 702 has placed an address on its address output leads and is requesting an access operation. Upon receiving an address strobe signal from the MPU, the internal control sequencer moves to one of the remaining seven states depending upon a variety of conditions which will be explained in detail hereinafter.

The second of the eight sequencer states is the acknowledge state (designated by the mnemonic "A"). While in this state the internal control sequencer signals MPU 702 that the requested access operation has been completed and the data requested by MPU 702 is available.

The third sequencer state is the special acknowledge state (designated as the "S" state). While in this state the sequencer enables the block status memory or other special registers, depending on the state of the processing element at the time the state is entered.

The fourth state is the read state (mnemonic "R"). In this state the internal control sequencer activates the external control sequencer to enable data to be read into cache memory 738 from the system main memory via the processor data bus.

The fifth state is the overflow state (mnemonic "O"). In this state internal control sequencer 700 produces the proper commands to service a cache "overflow". A cache overflow occurs if an item which would normally be retrieved from main memory and stored into cache memory 738 at a particular location cannot be stored into cache memory 738 because that location already contains valid data which must first be moved to main memory.

In particular, in the event of a cache "miss" occurring during an attempt to read information from cache memory 738, circuitry in the processing element attempts to transfer a block of data containing the addressed item from the system main memory into cache memory 738. If the attempted transfer is successful, data processing proceeds normally. If the attempted transfer results in a cache overflow, the block of information which is retrieved from main memory is stored in an "overflow buffer" location in cache instead of its normal location. The addressed item is then fetched from the overflow buffer and the instruction which was being executed by MPU 702 when the cache overflow occurred is allowed to complete. Normal data processing is then interrupted so that special circuitry as described in detail below can store previously modified portions of the data in cache memory 738 to main memory thereby making room for additional data in cache memory 738. Alternatively, if a cache overflow occurs on a write access to cache memory 738, the data to be written is temporarily stored in the cache overflow buffer until its normal memory location is cleared.

If, during a read or write access to cache memory 738, a page fault occurs, the sequence of operations is slightly different. The response to a page fault depends on whether the fault occurs on an attempt to read program code from cache memory 738, a data write operation or a data read operation. If a page fault occurs on an attempted code retrieval, instead of returning the requested instruction, the cache memory circuitry returns a special "trap" instruction. MPU 702 is programmed to recognize the trap instruction and thereupon initiate a request to become executive processor so that it can initiate a retrieval of the desired code from secondary storage.

Page faults which occur on data write attempts are treated similarly to cache overflows. That is, the data is temporarily stored in the cache overflow buffer and normal processing is interrupted. In response to the interrupt, the processing element again requests to become executive processor so that it can initiate the necessary retrieval of information from secondary storage and select a new user task.

Page faults which occur on data read attempts force the processing element to stop normal processing and request the current executive processor to bring the desired page of data into main memory from secondary storage. After the transfer of data from secondary storage to main memory has been accomplished, the executive processor informs the processing element experiencing the page fault of the locations in main memory containing the requested page. The processing element experiencing the page fault then resumes normal processing treating the page fault in much the same way as a cache overflow. In particular, the addressed data block is transferred to the cache memory and the currently executing instruction is allowed to complete. Normal processing is then interrupted so that the map in the memory management unit can be updated to indicate the location of the page in main memory. If a cache overflow also occurs in conjunction with the page fault the previously described processing which takes place after overflow also takes place after the page fault before normal operation resumes.

The next state of the processing element is the external state (designated by mnemonic "E") in which the processing element performs transfers other than those to, or from, main memory.

The next state is called the flush state (designated by mnemonic "F" ) in which the internal sequencer can control operation of the cache memory circuitry to store to main memory the contents of all of tee dirty data blocks in cache memory 738. As previously mentioned, in accordance with one aspect of the invention, the flushing operation is carried out by special purpose hardware connected with the cache memory which performs the flushing operation independent of direct control by MPU 702. In particular, MPU 702 can command a between-limits flush, in which case, the specialized hardware automatically flushes all dirty blocks found within the specified limit range to main memory. In addition, the special purpose hardware allows the MPU 702 to require that the status bits stored in the block status memory and associated with each block of data be reset when the block is flushed thereby initializing the block status memory for subsequent cache memory operations. The same circuitry can further be used to invalidate user or supervisor code blocks which operation greatly reduces the amount of time that would otherwise be needed to effect a context switch.

The last operational state of the processing element is called the move state (mnemonic "M"). In the move state, the internal sequencer generates signals which control additional circuitry to move data from one location in cache memory 738 to another location in cache memory 738. Such an operation is necessary because most computer programs involve frequent data transfers between user data and supervisor data areas in cache memory. For example, input/output operations are generally performed by a supervisor program on behalf of a user program. As a result, output data must be transferred from the user data area to the supervisor data area in cache memory. Similarly, input data from the supervisor area must be transferred to the user area. Since these intracache data transfers occur relatively frequently during the operation of the user program, inefficiencies in the transfer operation could significantly effect overall system performance and overhead. In addition, any inefficiencies are compounded by the fact that the data transfer operations are frequently byte-oriented and hence need not be aligned on 32-bit or even 16-bit boundaries.

With the aforementioned constraints, direct manipulation of the data by MPU 702 for each intracache data transfer could require repeated byte operations and alignment thereby slowing the operation of the MPU. In accordance with an additional aspect of the invention, each processing element has been provided with additional specialized hardware that automatically moves data in either direction between user and supervisor data areas in cache properly aligning the data in the process. A potentially large number of iterations through a program loop in MPU 702 (in general 1 iteration per byte of data that has to be transferred) is thereby reduced to a single MPU instruction which commands the specialized move hardware to transfer data between two specified areas in cache memory 738.

Each of the eight operational states of the processing element will now be described in detail in connection with FIGS. 7 and 8 and Tables I-VI which set forth the states and substates of operation.

In tables I-VI, the following abbreviations are used:

| LIST OF TABLE ABBREVIATIONS | | |
|---|---|---|
| Abbreviation | Description | Meaning |
| V | Valid Bit From Block Status Memory | Asserted = Dat block is Valid |
| D | Dirty Bit From Block Status Memory | Asserted = Data Block is "Dirty" |
| M | Match information | Asserted = Label in BS Memory Matches MPU Address |
| SA | Special Add. signal | Asserted = MPU address is Special Address |
| IR | Register Spec. Add. | Asserted = MPU Address is an Internal Register Address |
| ROM | Read-only Memory | Asserted = MPU Address is to Read-only Memory |
| IAK | Interrupt Acknowledge | Asserted = MPU Address is an interrupt acknowledge |
| EA | Ext. Special Add. | Asserted = MPU Address is an |

-continued

LIST OF TABLE ABBREVIATIONS

| Abbreviation | Description | Meaning |
|---|---|---|
| IM | Move Special Add. | External Special Address Asserted = MPU Address is Move Dest. Address |
| IF | Flush Special Add. | Asserted = MPU Address is Flush Destination Add. |
| BB | External Bus Busy | Asserted = External Bus is Busy |
| PF | Page Fault | Asserted = Page Fault Detected |
| T | Termination Address | Asserted = Flush Termination address Match |
| CL | Clear Mode | Asserted = Flush Operation is a Clear Operation |
| S0 | Source Address Bit | Bit 0 of Source Add. |
| D0 | Destination Add. Bit | Bit 0 of Dest. Add. |
| CM | Constant Mode | Asserted = Move Operation is a Constant Operation |

TABLE I

| STATE NAME | ACTION | CONDITON |
|---|---|---|
| IDLE (I) | | |
| IA. | Jump to state I | AS* |
| IB. | Jump to state A1 | AS and SA* and (V or D) and M |
| IC. | Jump to state R1 | AS and SA* and D* and (V* or M*) |
| ID. | Jump to state O1 | AS and SA* and D and M* |
| IE. | Jump to state S1 | AS and (IR or ROM or IAK) |
| IF. | Jump to state E1 | AS and EA |
| IG. | Jump to state M1 | AS and IM |
| IH. | Jump to state F1 | AS and IF |
| ACKNOWLEDGE (A) | | |
| (A1) | | |
| A1A. | Raise ACK to MPU | Unconditional on Entry |
| A1B. | Raise CE to cache | Unconditional on Entry (and'ed with data strobes) |
| A1C. | Raise WE to BS Mem | Unconditional on Entry |
| A1D. | Lower WE to BS Mem | Unconditional on Exit |
| A1E. | Jump to state A2 | Unconditional |
| (A2) | | |
| A2A. | Retain ACK to MPU | Unconditional |
| A2B. | Retain CE to Cache | Unconditional (AND'ed with data strobes) |
| A2C. | Lower ACK and Enables | Unconditional on Exit |
| A2D. | Jump to State I | Unconditional |
| SPECIAL ACKNOWLEDGE (S) | | |
| (S1) | | |
| S1A. | Raise ACK to MPU | Unconditional |
| S1B. | Raise Enables to Special Address Registers, RAMS, ROMs, etc. | Unconditional Based on Address Decode |
| S1C. | Jump to state S2 | Unconditional |
| (S2) | | |
| S2A. | Retain ACK to MPU | Unconditional |
| S2B. | Retain Enables to Special Address Registers, RAMs, ROMs, etc. | Unconditional Based on Address Decode |
| S2C. | Lower ACK and Enables | Unconditional on Exit |
| S2D. | Jump to state I | Unconditional |

Idle State

Table I shows the various operations performed in the Idle and Acknowledge states by internal sequence controller 700 (FIG. 7) based upon various signals received by the controller. In particular, a processing element is in its idle state while waiting for MPU 702 to initiate an access. At this time no special external functions (flush, move, etc.) are being performed. During the idle state all internal paths are set up in such a manner as to permit MPU 702 to initiate read and write cycles efficiently. In particular, addresses generated by MPU 702 pass through address decoder 714 and are applied, via cache address multiplexer 726, cache address latch 734 and cache address bus 735 to cache RAM 738 and block status memory 736. Block status memory 736 is enabled at all times so that its contents (valid bits, dirty bits and labels) can be checked in time to allow sequencer 700 to acknowledge the requested access without requiring the MPU 702 to wait if cache memory 738 contains the requested data.

Figure 9:
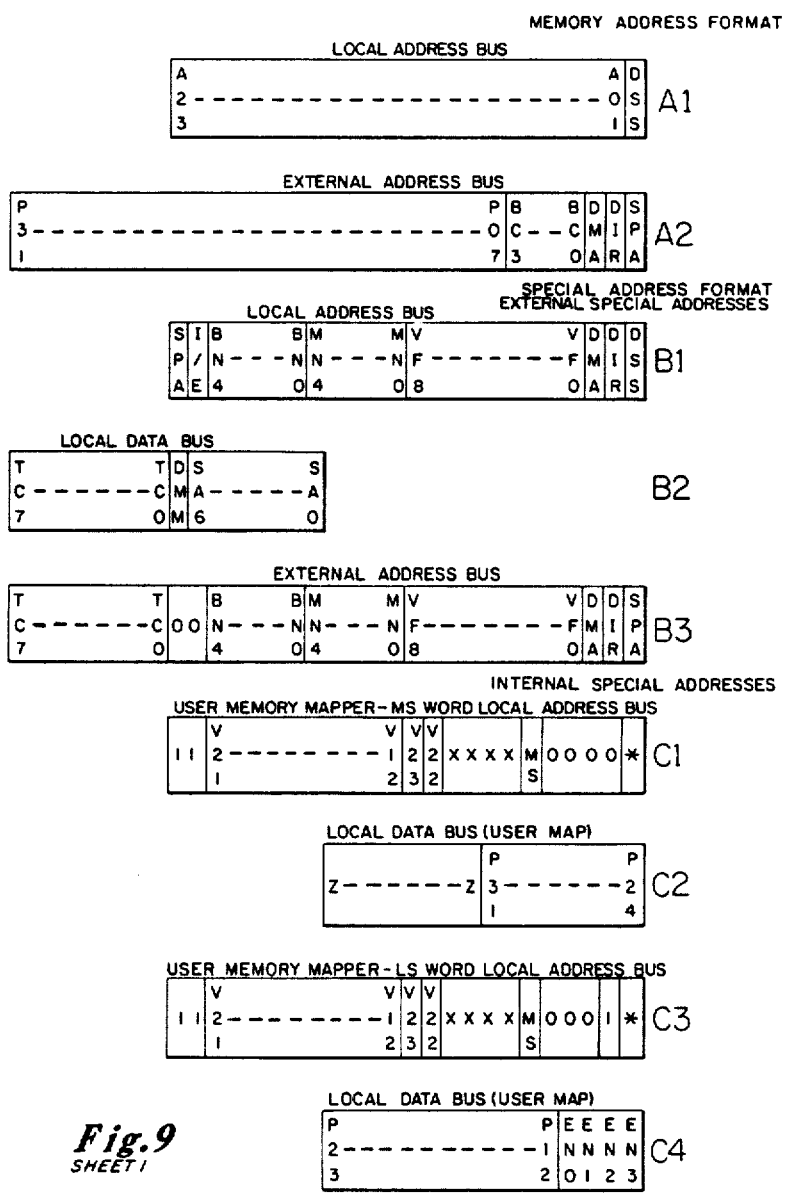
FIG. 9 of the drawing, consisting of three drawing sheets, shows the arrangement of information on each of the internal buses during the various internal operations.
Figure 9:
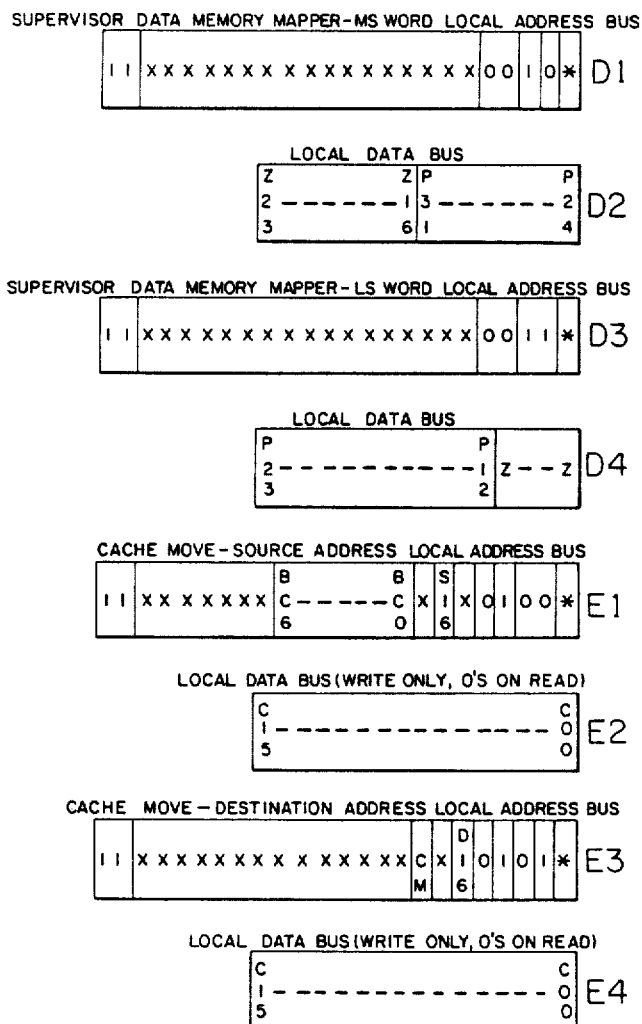
Figure 9:
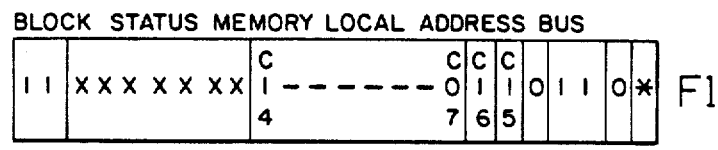
Figure 9:
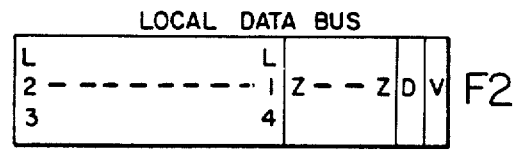
Figure 9:
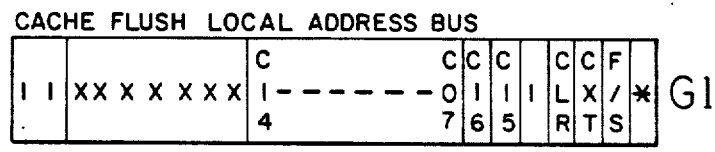
Figure 9:
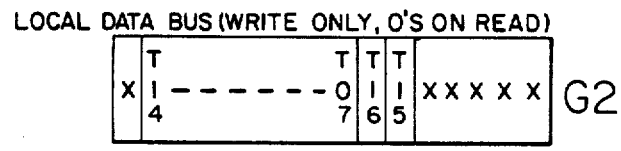
Figure 9:
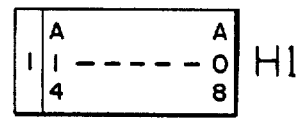

The address information produced by MPU 702 may be one of several types. For example, the address information may be address information used to access cache memory 738. The format of the information placed on the local address bus by MPU 702 during an ordinary cache memory access is shown in FIG. 9, line A1. Bits A01-A23 are the normal address bits. Bit A00 is not generated by MPU 702 but instead two data strobe signals are provided. The information on the local address bus may also be translated in order to access system main memory as will hereinafter be described. The translated information format is shown in FIG. 9, line A2 (to be discussed later).

The address information produced by MPU 702 may also be a "special" address. Special addresses are used by MPU 702 to control other portions of the circuitry. In particular, a special address is generated by MPU 702 by setting function code leads FC2—FC0 equal to "101", respectively, and bit A23 of the address equal to "1". Special addresses may be either "external" or "internal" addresses. External special addresses are used by MPU 702 to control elements external to the processing element. For example, external special addresses are used during direct memory access operations, (DMA operations) to control the operation of peripheral units and for other operations where the processing element coordinates and controls other elements in the computer system. FIG. 9, lines B1-B3 showed the arrangement of the data on the local address bus, the local data bus and the external address bus for an external address situation. In respect to the local address bus, bit A0, as previously described, is not generated by MPU 702 but instead two data strobe signals are used. Bit A1 is a direction bit which indicates the direction of the data transfer with respect to address module (1=read). Bit A2 is a bit that is set by MPU 702 to indicate to the bus adapters that the address is part of a DMA transfer. On a DMA transfer the processing element sends the destination address first and the source address last. In addition, if the transfer is a write operation the bus adapter acknowledges without receiving any data strobes. It then expects the data strobes in the next access. Bits A3-A7 are reserved for a variant field which selects one of the up to 512 addresses or functions within an addressed module.

Address bits 12-16 contain a coded module I.D. number. Similarly, bits 17-21 contain a "basket" number which together with the module I.D. number specifies a unique module in the system. Bits 22 and 23, as previously described, specify that the address is an internal or external special address.

The format of the local data bus for an external special address is shown in FIG. 9, line B2, in which bits SA0-SA6 specify the location in the I/O buffer (in cache) which contains the first word of the transfer. For DMA transfers this location contains the first memory address (the first of two memory addresses if DMM="1", as described below). This memory address is transmitted to a destination memory for bus adapter-to-memory transfers followed by the external special address (shown in FIG. 9, line B3). For memory-to-bus adapter transfers, the special address is sent first, followed by the source memory address.

The DMM bit is set by the MPU to select between a single memory and multiple memory DMA transfers. For a single memory transfer an address is taken from the designated location in the I/O buffer and sent to the bus. For multiple memory transfers, two memory addresses are taken from successive locations in the I/O buffer (DMM equal to "0" defines to a single memory transfer). The next 8 bits, TC0-TC7, are a transfer count which specifies one fewer than the number of words (for non-DMA transfers) or blocks (for DMA transfers) to be transferred.

Internal special addresses are used by MPU 702 to control the special processing element circuitry, such as during a cache move or cache flush operation. External special addresses are used by the MPU to control external elements. The distinction is specified by address bit A22 which is "1" for internal addresses and "0" for external addresses.

Referring to Table I, line IA, the processing element remains in the Idle state as long as the address strobe line (AS) produced by MPU 702 remains unasserted. When MPU 702 does assert a signal on address strobe line AS, sequence controller 700 enters one of the other processing states described above depending upon the status of signals received from block status memory 736 and MPU 702. In particular, to begin an access to cache memory 738, MPU 702 places an address on its address leads A0-A23 and asserts the address strobe signal on lead AS. The address outputs are provided, via drivers 704, to local address bus 730. The format of the address signals on bus 730 is shown in FIG. 9 line A1 in which A01-A23 correspond to address bits A1-A23. Bit A0 is not generated by MPU 702 which instead generates two data strobe signals. From bus 730 bits 7-13 of the address information are provided, via bus 731, to cache address multiplexer 726.

Bits 5,6 and 14-23 of the address information produced by MPU 702 are also provided to cache address translation logic 714. Translation logic 714 translates virtual address information into the appropriate fixed or overlayable region of cache memory (shown in FIGS. 5 and 6). It produces three output bits which are applied to multiplexer 726 along with the 7 bits from bus 731.

As previously explained, in the idle state, multiplexer 726 is controlled by sequence controller 700 to transfer the address information to cache address latch 734. Cache address latch 734 is controlled from sequence controller 700 to temporarily store the address information produced by multiplexer 726 and provide it to cache address bus 737.

Six low-order bits of the address information (bits 1-6) are provided to the cache address bus 737 from local address bus 730 over bus 733 and multiplexer 740 which is also controlled by sequencer 700.

Bits 7-16 produced at the output of cache address multiplexer 726 are also provided via bus 735 to the address inputs of block status memory 736. As previously described, block status memory 736 is continuously enabled so that its contents are immediately available, thereby avoiding a delay which would force MPU 702 to wait for a label match check if the requested data is available in cache memory 738. In particular, the outputs of block status memory 736 consisting of the ten or nine bit label (depending on whether the requested access is to supervisor or user space) and the valid and dirty bits are produced at output bus 747 and leads 741 and 739, respectively. The output label information on bus 747 is provided via bus 745 and output latch 754 to the memory mapping circuitry shown in FIG. 8, as will be hereinafter described.

In addition, the label information appearing on bus 747 is provided, via bus 743, to comparison gates 724. Gates 724 compare label information on bus 743 to address bits 15-23 of local address bus 730 which are provided to gates 724 over bus 725. The outputs of gates 724 indicate whether the label information stored in block status memory 736 matches the high-order bits of the virtual address produced on local address 730 by MPU 702. The match information is provided to internal sequence controller 700 and partially determines the further actions of the circuitry.

In response to the match information (M) and the dirty and valid bits (D and V), sequence controller 700 determines whether the requested access has resulted in a cache "hit" or a cache "miss". As shown in line IB of Table I, a cache hit occurs if a label match has occurred, the dirty and valid bits indicate that the data is either dirty or valid and the specified address is not a special address (determined by controller 700 by examining address bit A23—A23="1" is a special address).

Line IC of Table I indicates the conditions for a cache "miss". A cache miss occurs when the address strobe signal (AS) is asserted, the requested address is not a special address (SA*), and the signals from block status memory 736 indicate that the requested data is not dirty and either is not valid or there is no label match.

Acknowledge State

Assuming a cache hit occurs, sequencer 700 proceeds to acknowledge state A, consisting of substates A1 and A2. When in acknowledge state A1, sequence controller 700 asserts the ACK lead to MPU 702 indicating that the requested data is available in cache memory 738. Controller 700 then asserts the cache enable lead (CE) to cache memory 738 which enables the memory so that in the case of a read operation, data stored in it can be gated, via drivers 748, to local data bus 732. Alternatively, in the case of a write operation, data placed on local data bus 732 by MPU 702 is applied to "shuffle bus" 856 (shown in FIG. 8) by means of drivers 852 which are controlled by sequencer 700. From bus 852, the data passes via enabled drivers 854 to bus 862 and the data input of cache memory 738.

Subsequently, (Table I, line A1C) controller 700 asserts the write enable (WE) lead to block status memory 736 to allow new label, dirty and valid information to be written to memory 736 thereby updating it to correspond to the new status of cache memory 738. In the case of a read operation, the block status label (bits 15–23 of the virtual address) is unchanged and thus the same label is rewritten into block status memory 736. In the case of a write operation, the same block status label is written into block status memory and the dirty bit is set in the proper location to update the memory. More particularly, the "label" information (bits 15–23 of the virtual address information) are provided via multiplexer 750 to the data input of block status memory 736 to enable the information to be written into the appropriate location.

Block status memory 736 may also be written directly by MPU 702 in order to allow the MPU operating system to set up the block status memory. Specifically, to load block status memory 736, MPU places an address on local address bus 730 in the format shown in FIG. 9, line F1. As shown in FIG. 9, bits C07–C16 are cache address bits specifying the particular block status memory location to be written; these bits are placed on the cache address bus 737 from the local address bus 730, via bus 731 and cache address multiplexer 726. The information to be written into the specified location is placed by MPU 702 onto the local data bus 732 in the format shown in FIG. 9, line F2, where "V" is the valid bit, "D" is the dirty bit, Z-Z are zeroes and L14–L23 are the label information. From the local data bus, the data is applied to the data input of the block status memory via multiplexer 750.

After the status information has been written into block status memory 736, sequencer 700 proceeds to acknowledge state A2 where the ACK lead and enable signals to memories 736 and 738 are lowered, completing the processing of a cache hit and returning the processing element to the idle state.

Assuming now that a cache miss occurs on an attempted read access to cache memory (Table I, line IC), the requested information stored in the computer's main memory must be transferred into the cache memory before processing can be completed, therefore, sequencer 700 precedes to the read state R.

Special Acknowledge State

The special acknowledge state is used to inform MPU 702 that an operation requested by a special address (for example, a flush or move operation) has been completed. The special acknowledge state has two substates S1 and S2. In substate S1 (Table V, line S1A) the ACK lead is asserted, informing MPU 702 that the requested operation has been completed. Various registers which hold the results of the special operation are enabled to provide the data to MPU 702 (line S1B). Sequencer 700 then jumps to substate S2 (Table I, line S1C) where the ACK lead is maintained asserted to allow the required data to be transferred (lines S2A and S2B). Finally, the enables are removed and the sequencer returns to the idle state (lines S2C and S2D).

Read State

Read state R has four substates R1–R4 which are set forth in Table II. In read state R1, line R1A, the external sequencer is started in order to transfer information from system main memory into cache memory.

TABLE II

| STATE NAME READ (R) | ACTION | CONDITION |
|---|---|---|
| (R1) | | |
| R1A. | Start External Sequencer | Unconditional on Entry |
| R1B. | Jump to state R1 | BB and (PF* or R and CD*) |
| R1C. | Jump to state 01 | PF and R* |
| R1D. | Jump to state R2 | BB and PF and R and CD |
| R1E. | Jump to state A1 | BB* |
| (R2) | | |
| R2A. | Stop External Sequencer | Unconditional on Entry |
| R2B. | Enable Trap Instruction to LDB | Unconditional |
| R2C. | Raise ACK to MPU | Unconditional on Entry |
| R2D. | Jump to state R3 | Unconditional |
| (R3) | | |
| R3A. | Keep Trap Instruction Enabled to LDB | Unconditional |
| R3B. | Retain ACK to MPU | Unconditional |
| R3C. | Lower ACK to MPU | Unconditional on Exit |
| R3D. | Jump to state I | BB* |
| R3E. | Jump to state R4 | BB |
| (R4) | | |
| R4A. | Do nothing | Unconditional |
| R4B. | Jump to state R4 | BB |
| R4C. | Jump to state I | BB* |

In particular, the external sequencer forwards a physical address to the system main memory which responds, as previously described, by returning a block of data containing the requested information. The data block is, in turn, stored in the appropriate location of cache memory 738. The physical address used to address main memory is produced by the memory management circuitry shown in FIG. 8 which is controlled by sequencer 700 to translate the virtual address produced on address leads A1–A23 of MPU 702.

If the access request by MPU 702 to cache memory 738 was a user data read or write operation or a user code fetch, then the required address translation is performed by map RAM 814 shown in FIG. 8. In particular, bits 12–23 of local address bus 804 are gated, via bus 808, to user map multiplexer 810 under control of sequencer 700. Multiplexer 810 is, in turn, controlled by sequencer 700 to forward the address information over bus 812 to the address inputs of map RAM 814. In response to the address inputs, map RAM 814 provides a 20-bit translated physical address output (UMAP bits 12–31 which become the high-order bits of the physical address) over bus 818 to module address bus multiplexer 838.

The translation information is written into map RAM 814 following a context switch by MPU 702 using an internal special address command. Since the map RAM contains 20-bit address information and the local data bus is only 16 bits wide the loading operation must take place in two steps. The most significant word (MS word) is loaded first, then the least significant word (LS word). The formats of the information on the local address bus and the local data bus are shown in FIG. 9, lines C1–C4. Line C1 shows the format on the local address bus for loading the MS word into map RAM 814. Bits V12–V23 are the address into which the physical address information is to be loaded. Bit MS selects the portion of the map RAM to be accessed (MS="1"

for user code and MS="0" for user data). FIG. 9, line C2 shows the information on the local data bus which is to be inserted into the location specified in line C1. Bits P24–P31 are the physical address to which the specified location will map when accessed. Bits Z are zeroes on reads and don't cares on writes.

Similarly, FIG. 9, lines C3 and C4 show the information format on the local address bus and the local data bus for loading the LS word. The information is analogous to that in the MS word with the exception of bits EN0–EN3 which are quadrant enable bits. Each page in main memory is divided into four quadrants of equal size. Each quadrant enable bit, when set to "1" indicates that its corresponding quadrant is enabled indicating, in turn, that the data for that quadrant is available in main memory. If an access is attempted to a quadrant whose corresponding enable bit is set to "0" a page fault will result.

The loading operation is performed by sequencer 700 by controlling multiplexer 810 to connect bits 12–23 of local address bus 804, via bus 808 and bus 812, to the address inputs of map RAM 814. In addition, sequencer 700 enables drivers 822 to connect local data bus 806 to the data inputs of map RAM 814 via bus 820.

In accordance with another aspect of the invention, instead of loading map RAM 814 with translation data, the illustrative circuitry can be used to automatically clear map RAM 814 during a context switch without requiring intervention by MPU 702. In particular, during an auto-clear operation sequencer 700 controls multiplexer 810 to connect the output of clear counter 800 on bus 801 to the address inputs of map RAM 814, via bus 812. In addition, sequencer 700 enables drivers 816 which drive "0"s into the quadrant enable bits locations of map RAM 814. To perform the clearing operation, counter 800 is reset and steps through all locations of map RAM 814. Therefore the quadrant enable bits of all locations are set to "0" causing all entries in the RAM 814 to be invalidated.

If a read access is performed to an area of supervisor data space which is mappable, the required translation is provided by supervisor translation register 824. Register 824 is a 20-bit register which contains the required translation information. This translation information is selected by the MPU by controlling multiplexer 838 to select the output of the supervisor map register 824 (bits SMAP 12–31) via bus 828.

Module address bus multiplexer 838 is controlled by signals produced by sequencer 700 and signals on cache address bus 737 (FIG. 7). In particular, selection signals are provided from sequencer 700 directly to multiplexer 838. Bits 12–16 of the cache address bus are provided, via bus 846, to decoder 844 which, in turn, provides additional selection signals over bus 842 to multiplexer 838.

The supervisor data register may also be loaded with new information at a context switch in a similar manner to the user map RAM 814. In particular, the loading information format is shown in FIG. 9, lines D1 and D3, for the local address bus. Since there is only one "location" in the supervisor translation register, no address information is provided. The address is the same for the MS and LS words with the exception of bit A1 ("0" for MS word and "1" for LS word). In FIG. 9, line D2, the information on the local address bus is shown for the MS word loading operation. Bits P24–P31 are the physical address bits to which the mappable supervisor data page will map when accessed. Bits Z16–Z23 are the physical address bits 16–23 obtained from the map register on a read operation and are "don't cares" on a write to the register. Similarly, the information format on the local data bus for a load of the LS word is shown in FIG. 9, line D4.

The supervisor data register may be read by MPU 702 by applying the information format shown in FIG. 9, lines D1 and D3 for the MS word and LS word, respectively to the local address bus 804. This information controls multiplexer 826 (bit A01 in particular), via lead 823, to gate portions of the register output over buses 825 and 830 through multiplexer 826 onto local data bus 806 via bus 832. In particular, the high-order bits (bits 8–15) of the MS and LS physical address words are provided directly to the local data bus via bus 834. The low-order bits (0–7) are controlled by multiplexer 826 in the format shown in FIG. 9, lines D2 and D4, for the MS and LS words respectively and provided to local data bus 806 via bus 832.

If the read access is to non-mappable supervisor data then multiplexer 838 is instead controlled to place bits 7–23 of the local address bus (obtained from bus 835) onto bus 839.

Information transfer between main memory and cache memory 738 is always carried out on a block basis (one block is 128 bytes of data). Twenty-five bits of address information are needed to specify a particular block in main memory and, as previously described, 20 of the required 25 bits are provided from user map RAM 814 or supervisor translation register 824. The remaining five bits are set equal to bits A07–A11 of the virtual address which are gated to multiplexer 838 from local address bus 804 via bus 834.

The physical address sent to the main memory consists of a total of 32 bits of information and the format of the address information is shown in FIG. 9A2. The address is broken into 25 physical address bits (P07–P31) and 7 control bits (SPA, DIR, DMA, and BC0–BC3). The control bits are set by MPU 702 and are used to inform the remainder of the system of the type of access requested. In particular, bit SPA is set by MPU 702 and indicates whether the address is a special address. It is set to "0" by MPU 702 for a memory access operation. Bit DIR indicates the transfer direction with respect to the PE ("1" is a read operation) The DMA bit is set by MPU 702 and is used to determine whether the address is part of a DMA transfer. The remaining control bits specify the length of the transaction in blocks.

The control bits are generated by a permanently-wired pattern generator over bus 841. The completed 32-bit address is forwarded at the output 839 of multiplexer 838 to the "shuffle bus" circuitry consisting of drivers 850, 852, 854, 858 and shuffle bus 856. In particular, to transfer the 32-bit address to the processor bus for transmission to the main memory, sequencer 700 enables driver 850 and 858. The address information is thereby transferred from multiplexer output bus 839, via driver 850, shuffle bus 856 and driver 858 to external address bus 864. Under control of sequencer 700, the information on bus 864 is latched in output latch 866 from which it is gated under control of the external sequencer, over bus 870, to the processor buses and from there, as previously described, to the main memory.

While the information transfer is taking place between main memory and the cache memory, sequencer 700 monitors the busy line (BB) from the external sequencer to determine when the requested information transfer has been completed (line R1B of Table II). Sequencer 700 also monitors the output of page fault circuit 873, the read/write lead (R) from MPU 702 and the function code leads (FC0-FC2) from MPU 702.

Page fault circuit 873 monitors the physical address information at the output of user map RAM 814 on bus 818 by checking the quadrant enable bits of the requested page to determine whether the information is available in main memory. If the information is not available in main memory a "page fault" situation occurs and a signal is sent to sequencer 700 by page fault detect circuit 873. The function code leads from MPU 702 indicate whether the requested access is a code access (an access to either supervisor or user code space) or a data access.

If the requested access is to data space and no page fault occurs, then internal sequencer 700 jumps to acknowledge state A1, as shown on Table I, line R1E, as soon as the external control sequencer indicates the transfer of information from main memory to cache memory has been completed. In particular, to complete the transfer, the external control sequencer gates information obtained from the main memory via the processor bus onto bus 860 and from there, via bus 862, to the data input of cache memory 738.

If a page fault occurs during a write operation, as indicated in line R1C of Table II, an overflow condition occurs and internal sequencer 700 enters overflow state 01, as shown in Table III. Processing of an overflow condition will hereinafter be discussed in detail.

If, on the other hand, a page fault condition occurs on a read operation to either supervisor or user code space, as shown in line R1D, the sequencer enters read substate R2, shown in Table II. As shown in Table II, page faults which occur on a code read are treated differently from normal page fault processing. In this case, MPU 702 is forced into bringing the required data block from main memory into cache itself rather than making a request to the executive processor for page fault service in the case of normal page fault servicing. In particular, in line R2A the external sequencer is disabled and instead a special "trap" instruction is gated onto the local data bus from hardwired instruction coder 872 (line R2B) in place of the requested instruction. Internal sequencer 700 then asserts the ACK lead to MPU 702 indicating the requested instruction is ready on the local data bus. The MPU 702 recognizes the trap instruction as a special instruction and executes a predetermined program which causes it to request the proper block of code from main memory and transfer it into cache memory 738.

In particular, the trap instruction causes the affected processing element to request to become the executive processor so that it can initiate a transfer in of the desired code. After the processing element becomes the executive processor it also performs other executive functions including selecting for itself a new user task as previously described.

After placing the trap instruction on the local data bus and disabling the external sequencer, sequencer 700 jumps into read substate R3, in which it waits for a short time keeping the trap instruction on the local data bus and the ACK lead asserted, as shown in lines R3A and R3B and then lowers the ACK lead to MPU 702 and waits until the external bus is no longer busy as indicated by the negation of the BB signal by the external sequencer. In some cases, the external sequencer may take longer than a single clock cycle to terminate and if so, as indicated in Table II, line R3E, the sequencer jumps to substate R4 which causes it to wait until the external sequencer terminates at which point, as shown in line R4C, it returns to the idle state.

Overflow State

Overflow processing is shown in Table III. The operation of sequencer 700 in servicing an overflow condition depends on whether the attempted access which caused the overflow condition was a read or write access. In addition, there are two ways to enter state O1. One way is if an overflow occurs when sequencer 700 responds to an access request while it is in the idle state, as shown in line ID of Table I. This condition is detected if the accessed information is dirty but there is no match between the bock status label stored in the block status memory and the "label" portion of the requested address. The other way that overflow state O1 is entered is if a page fault occurs on a write operation, as shown in Table II, line R1C.

TABLE III

| STATE NAME OVERFLOW (O) | ACTION | CONDITION |
|---|---|---|
| (01) | | |
| O1A. | Enable External Sequencer | R |
| O1B. | Disable External Sequencer | R* |
| O1C. | Enable Address Overflow Buffer Address to CAB | Unconditional |
| O1D. | Enable VA etc. to SDB | Unconditional |
| O1E. | Jump to state 02 | R* |
| O1F. | Jump to state 03 | R |
| (02) | | |
| O2A. | Retain VA etc. to SDB | Unconditional |
| O2B. | Retain AOVF Addr. to CAB | Unconditional |
| O2C. | Raise CE to cache | Unconditional on Entry |
| O2D. | Raise WE to BS Mem | Unconditional on Entry |
| O2E. | Jump to state 03 | Unconditional |
| (03) | | |
| O3A. | Enable LDB to SDB | Unconditional |
| O3B. | Enable Data Overflow Buffer Address to CAB | Unconditional |
| O3C. | Issue Level 7 Interrupt | |
| O3D. | Jump to state 03 | BB |
| O3E. | Jump to state 04 | BB* |
| (04) | | |
| O4A. | Raise ACK to MPU | Unconditional on Entry |
| O4B. | Retain LDB to SDB | Unconditional |
| O4C. | Retain DOVF Addr. to CAB | Unconditional |
| O4D. | Raise CE to cache | Unconditional on Entry |
| O4E. | Raise WE to BS Mem | Unconditional on Entry |
| O4F. | Lower WE to BS Mem | Unconditional on Exit |
| O4G. | Jump to state 05 | Unconditional |
| (05) | | |
| O5A. | Retain ACK to MPU | Unconditional |
| O5B. | Retain LDB to SDB | Unconditional |
| O5C. | Retain DOVF Addr. to CAB | Unconditional |
| O5D. | Retain CE to cache | Unconditional AND'ed with data strobes |
| O5E. | Lower ACK and Enables | Unconditional on Exit |

TABLE III-continued

| STATE NAME OVERFLOW (O) | ACTION | CONDITION |
|---|---|---|
| O5F. | Jump to state I | Unconditional |

If the operation which caused the overflow is a read operation, as shown in line O1A of overflow substate O1, the external sequencer is enabled to begin the transfer of information from the main memory to cache memory in the same manner as if an overflow condition had not occurred. However, since the space in cache memory 738 into which the incoming information is to be placed is not available, the incoming information is instead placed in one of two special cache "data overflow buffers" which are predetermined portions of the supervisor data area of cache memory 738. As shown in line O2F, after starting the external sequencer, sequencer 700 proceeds to substate O3.

In overflow substate O3, line O3B, sequencer 700 controls overflow multiplexer 722 and cache address multiplexer 726 to gate the address of the data overflow buffers onto cache address bus 737. The cache overflow buffer address consists of a predetermined bit pattern and bits 0-6 of the virtual address provided via bus 731 and multiplexer 726. In particular, the data overflow buffer address on cache address bus 737 specifies one of two data overflow buffers (designated as buffer 0 or buffer 1) as determined by virtual address bit 7 which is provided by multiplexer 722. The buffer locations specified by virtual address bits 0-6 are written to with the incoming data from the main memory.

Next, as shown in line O3C, a special interrupt (level 7 interrupt) is generated by sequencer 700 which causes MPU 702 to stop normal processing and flush cache memory 738 to main memory to make room for the information in the overflow buffers after it finishes execution of the current instruction. The operations of MPU 702 upon receiving a level 7 interrupt are described in detail below.

After generating the level 7 interrupt internal sequencer 700 remains in substate O3, as shown in line O3D, until the external sequencer indicates that the incoming data from the main memory has been transferred into the cache memory as shown in line O3E at which time sequencer 700 moves to substate O4.

In substate O4, line O4A, the ACK lead is asserted to MPU 702. In lines O4B and O4C, sequencer 700 retains the connection between the local data bus and the shuffle bus and retains the data overflow buffer address on the cache address bus. Subsequently, as shown in line O4D, the cache enable lead is asserted providing the requested data from the overflow area in cache memory 738 to MPU 702. In lines O4E and O4F, the block status location for the data overflow buffer is updated to indicate that the location addressed by MPU 702 is valid and to also store the corresponding label (virtual address bits 15-23). Sequencer 700 then proceeds to overflow substate O5.

In overflow substate O5, as shown in lines O5A-O5D, sequencer 700 maintains the certain address and control signals. In line O5E the ACK signal and all of the memory enables are lowered to complete the send operation and, in line O5F, sequencer 700 returns to its idle state.

Alternatively, if an overflow condition occurs during a write operation, a different processing routine is followed. This routine is more complicated than overflow processing during a read operation since the write address must also be saved during processing and later reconstructed to place the overflow data in its proper location. In order to save all the data and address information necessary to reconstruct the overflowed operation, address information overflow buffers are used in addition to data overflow buffers.

As shown in line O1B, an overflow during a write operation causes sequencer 700 to disable the external sequencer immediately since no information will be transferred until later in the processing. Sequencer 700 then controls cache address multiplexer 726 to gate a predetermined address onto cache address bus 737 via cache address latch 734. The predetermined address specifies one of the two address overflow buffer areas (designated as address buffers 0 and 1—the selection between the two address overflow buffers is made by examining the state of virtual address bit 7). Specifically, sequencer 700 controls overflow multiplexer 722 to gate virtual address bit 7 from the local data bus, via bus 723, into cache address multiplexer 726 and from there to the cache address bus. The remainder of the special address is generated by a permanently wired pattern generator connected to multiplexer 726 and virtual address bits 0-6 received form multiplexer 726 over bus 731. Sequencer 700 then enables a path between local address bus 804 to shuffle bus 856 (line O1D) by controlling multiplexer 838 to provide address information from the local address bus 804 (bits 8-14), via bus 835, to bus 839 and from there, via enabled driver 850, onto shuffle bus 856. From shuffle bus 856 the address information can be driven onto bus 862 via driver 854 to enable selected portions of the address information to be written into the cache address overflow buffer locations as will be hereinafter described. Sequencer 700 then jumps to substate O2 (line O1E).

As shown in lines O2A and O2B, the address of the address overflow buffer is retained on the cache address bus and the data path from the local address bus and the shuffle bus is also retained. Next, as shown in line O2C of substate O2, the enable lead to cache memory 738 is asserted to enable the address information to be written into the memory. More particularly, the byte locations in the address overflow buffer specified by virtual address bits 0-6 are all written with the data pattern shown in FIG. 9, line H1. In this pattern the setting of the most significant bit of each address byte equal to "1" indicates that the associated byte in the data overflow buffer has been modified. The remaining bits of each byte in the address overflow buffer contain virtual address bits 8-14 of the location originally addressed by MP 702.

Similarly, as shown in line O2D, the write enable lead (WE) is asserted to block status memory 736 to enable status information and a new label (bits 15-23 of the virtual address) to be written into that memory.

Sequencer 700 then jumps to substate O3 (as shown in line O2E) where processing continues as described in connection with read overflow processing with the exception that instead of the data overflow buffers being written with information obtained from the main memory, a connection is set up between the local data bus and the shuffle bus (over bus 869 and driver 852) as set forth in line O3A to allow data to be written into the addressed data overflow buffer from MPU 702.

In response to a level 7 interrupt generated during overflow handling by sequencer 700, MPU 702 reads an interrupt status word in order to determine whether a block overflow has occurred, and, if so, which data space overflowed (either user data or supervisor data). MPU 702 then determines whether any write overflows have occurred by placing the virtual address of the data overflow buffer block status word on the local address bus. The format of the information on the local address bus is shown in FIG. 9 line F1. Bits 1–4 are in a preset pattern (0110). Bits C7–C16 are the part of the cache address used to address the block status memory. (the X's are don't cares for a block status read). Finally bits 22 and 23 are set ("1") indicating that the address is an internal special address. This address information is gated, via multiplexer 726 and bus 735, to block status memory 736. The output of block status memory 736 is provided, via bus 749, to driver 752 and from there to the local data bus over bus 761, local data bus 732 and drivers 716 to MPU 702. The output of memory 736 is formatted as shown in FIG. 9, line F2. Bit V is the valid bit; bit D is the dirty bit; bits Z are zeroes and bits L14–L23 contain the label information. MPU 702 examines the dirty bit for each of the data buffers and if this bit is set ("1") then write overflow processing is necessary; otherwise read overflow processing is performed.

The MPU actions on read overflow processing require only that the appropriate data space (either user or supervisor) in cache be flushed as will hereinafter be described to make room for the new data temporarily stored in the overflow buffers.

Write overflow processing is somewhat more complicated since the written data must be recovered from the overflow buffers and returned to the appropriate locations in memory. In particular, for each data overflow buffer which is dirty, the corresponding address overflow buffer is scanned to determine any bytes containing the most significant bit set. As described above, the corresponding bytes in the data overflow buffer contain the overflowed write data.

A cache flush is first performed on the appropriate data space (user or supervisor) to make room for the overflowed data. Next, the virtual addresses for the overflowed data must be constructed for each overflowed block. The reconstruction is done for each block by using as bits 15–23 of the the reconstructed address the label information stored in the block status memory for each block. Bits 8–14 of the reconstructed addresses are provided from the information stored in each address overflow buffer location previously identified as having its most significant bit set. Bits 0–6 are determined by the locations in the overflow buffer which hold the information and bit 7 is determined by the overflow buffer involved (either 0 or 1).

After the address information has been reconstructed, the cache blocks indicated by bits 8–14 of the reconstructed addresses are saved by moving them to another available block in cache.

The reconstructed addresses are then used to access main memory via the memory management circuitry as previously described in order to bring the affected data blocks into cache. These blocks are then modified in accordance with the data stored in the data overflow buffers and the modified blocks are flushed back to main memory.

A second flush is then performed on the affected data space. Next, the blocks previously saved are moved back to their appropriate cache locations and a second flush is performed on them. Finally, the overflow buffers and block status locations for the overflow buffers are cleared.

External State

Table IV shows the processing steps for processing a transfer of data between the processing element and external locations other than main memory.

TABLE IV

| STATE NAME EXTERNAL (E) | ACTION | CONDITION |
|---|---|---|
| (E1) | | |
| E1A. | Enable External Sequencer | Unconditional on Enty |
| E1B. | Enable I/O Buffer Address to CAB | Unconditional |
| E1C. | Jump to state E1 | BB |
| E1D. | Jump to state S1 | BB* |

As shown in line E1A, the external sequencer is enabled to begin transfer of the data information to the remainder of the computer system. In line E1B the appropriate I/O buffer address is placed on the cache address bus. In particular, overflow multiplexer 722 is controlled by sequencer 700 to place bits 5 and 6 of the local data bus on cache address bits 7 and 8 thereby specifying the I/O buffer to be used n the transfer. The remainder of the I/O buffer address is loaded from local data bus bits 0–4 into external address counter 742. Sequencer 700 then thereupon controls multiplexer 740 to place the external address on the cache address bits 1–6. Counter 742 can be incremented under control of controller 700 to allow successive data words to be transferred over the external bus. The data words to be sent to the computer system are assembled by the module address bus multiplexer 838 (FIG. 8). In particular, multiplexer 838 is controlled by sequencer 700 and decoder 844 to place bits 1–21 of the local address bus (obtained from bus 835) and bits 8–15 of the local data bus 806 (obtained from bus 836) onto bus 839 in the format shown in FIG. 9, line B3. From bus 839 the information is provided over enabled driver 850 to shuffle bus 856. From bus 856 the external information is provided to latch 866 by way of driver 858 and bus 864. The information is latched into latch 866 and subsequently forwarded to the remainder of the system over bus 870 under control of the external sequencer as previously described. Sequencer 700 remains in substate E1, as shown in line E1C, until the information has been transferred at which point, as shown in line E1D of state E1, sequencer 700 jumps to state S1 and performs a special address acknowledge as previously described.

Flush State

The actions taken during a flush of information from the cache address memory 738 into main memory are shown in Table V and consists of seven sub-states F1–F7. As previously explained, the flush circuitry allows the processing element to transfer the contents of the cache memory into system main memory when a clearing of the cache memory is necessary at a context switch. In particular, the circuitry is arranged so that the flushing or storing operation is initiated by a single processor command and continues between limits set by the processor. While the flush operation is underway no intervention from MPU 702 is necessary. Circuitry used during a flush operation consists of multiplexer 720 and flush destination counter 718. As previously described, the flushing circuitry automatically flushes all dirty blocks found in a specified range of addresses.

TABLE V

| STATE NAME FLUSH (F) | ACTION | CONDITION |
|---|---|---|
| (F1) | | |
| F1A. | Load Flush Address | Unconditional on Exit |
| F1B. | Jump to state F2 | Unconditional |
| (F2) | | |
| F2A. | Enable Flush Address to CAB | Unconditional |
| F2B. | Enable BS Label to MM | BB* |
| F2C. | Latch CAB to cache and BS Label to MM | BB |
| F2D. | Jump to state F2 | D and BB |
| F2E. | Jump to state F3 | CL* and D and T* and BB* |
| F2F. | Jump to state F4 | (CL or D*) and T* |
| F2G. | Jump to state F5 | (CL or D*) and T |
| F2H. | Jump to state F6 | CL* and D and T and BB* |
| (F3) | | |
| F3A. | Enable External Sequencer | Unconditional on Entry |
| F3B. | Raise WE to BS Mem | Unconditional on Entry |
| F3C. | Retain Flush Addr. to CAB | Unconditional |
| F3D. | Latch CAB to cache and BS Label to MM | Unconditional |
| F3E. | Lower WE to BS Mem | Unconditional |
| F3F. | Add 128 to Flush Address | Unconditional on Exit |
| F3G. | Jump to state F2 | Unconditional |
| (F4) | | |
| F4A | Raise WE to BS Mem | Unconditonal on Entry |
| F4B. | Retain Flush Addr. to CAB | Unconditional |
| F4C. | Latch CAB to cache and BS Label to MM | BB |
| F4D. | Add 128 to Flush Address | Unconditional on Exit |
| F4E. | Lower WE to BS Mem | Unconditional on Exit |
| F4F. | Jump to state F2 | Unconditional |
| (F5) | | |
| F5A. | Latch CAB to cache and BS Label to MM | BB |
| F5B. | Raise WE to BS Mem | Unconditional on Entry |
| F5C. | Lower WE to BS Mem | Unconditional on Exit |
| F5D. | Jump to state F7 | Unconditional |
| (F6) | | |
| F6A. | Enable External Sequencer | Unconditional on Entry |
| F6B. | Latch CAB to cache and BS Label to MM | BB |
| F6C. | Raise WE to BS Mem | Unconditional on Entry |
| F6D. | Lower WE to BS Mem | Unconditional on Exit |
| F6E. | Jump to state F7 | Unconditional |
| (F7) | | |
| F7A. | Latch CAB to cache and BS Label to MM | BB |
| F7B. | Jump to state F7 | BB |
| F7C. | Jump to state S1 | BB* |

In flush state F1, line F1A, the starting flush cache address is loaded into flush destination counter 718. In particular, sequencer 700 controls multiplexer 720 to transfer bits 5-14 of the local address bus 730 into the load ports of the flush destination counter 718. During a cache flushing operation MPU 702 generates address signals with a format shown in line G1 of FIG. 9. In particular, bits C07-C16 are used to indicate the block at which to begin an automatic flush operation. Bits 1, 2 and 3 generated on the local address bus are control bits used to control the operation of the flushing circuitry. In particular, bit CLR is an "auto-clear" bit which, when set, indicates that a flush is not to be performed but rather that the block status memory locations in the address range specified is to have all valid and dirty bits cleared as specified by the CXT and F/S bits. Bit CXT is a context switch bit which indicates that the flush is being done as part of a context switch. If the flush is being done as part of a context switch the valid bit in the block status memory will be cleared flush. If the flush is not being done as part of a context switch, the valid bit remains set (CXT = "1" indicates the flush is part of a context switch). The F/S bit determines whether a first or second flush is being performed on a given data block or address range. If the flush is a first flush the dirty bit will remain set, if it is a second flush the dirty bit will be cleared (F/S = "0" for first flush).

In addition to placing the starting address on the local address bus, MPU 702 also places a termination address on local data bus 732, as shown in line G2 in FIG. 9. In particular, termination bits T07-T16 specify the cache address at which to terminate the automatic flushing operation. Therefore, the automatic flushing operation will flush all dirty blocks of cache between address C07-C16 (generated on the local address bus) and address T07-T16 (generated on the local data bus).

The termination address information is also provided from local data bus 732 to sequence controller 700 where it is compared to the output of flush destination counter 718 which is provided to sequencer 700 over bus 715. When the addresses are identical sequencer 700 discontinues the automatic flushing operation.

As shown in state F2, line F2A, sequencer 700 then places the flush address generated by counter 718 on cache address bus 737 by controlling multiplexer 726 The output of multiplexer 726 is provided to latch 734 to allow the cache address to be temporarily stored if the external bus mechanism is busy. The temporary storing allows the flush circuitry to prepare the next flush address while waiting for the external bus to become free. The flush address is also provided to block status memory 736 to obtain the status information stored therein. The output of memory 736 is also provided via buses 747 and 745 to latch 754 which temporarily stores the status information if the external bus is busy.

After providing the starting flush address to the appropriate memories, the subsequent operations of sequencer 700 depend on whether the operation is a clear operation or a normal flush operation as indicated by the status of the clear bit in the address information on the local address bus and whether the flush termination address has been reached as indicated by a match of the flush termination address on the local data bus to the output of the flush destination counter 718. Before actually performing the transfer of data to the main memory sequencer 700 checks the status of the dirty bit obtained from the block status memory.

As shown in line F2D of flush substate F2, the sequencer remains in substate F2 if the block to be flushed is dirty and the external bus is busy. Assuming that the operation is not a clear operation and the flush address has not been terminated, when the external bus becomes free as shown in line F2E of flush substate 2, flush substate 3 is entered. In flush substate 3 the information to be flushed is transferred to the main memory.

The address in main memory into which the cache information is to be written is provided by the module address bus multiplexer 838. In particular, for a flush of user data, the high order bits 12-31 of the address are provided by the output of the user ma RAM 814 (UMAP bits 12-31). Bits 7-11 of the address are provided to multiplexer 838 from flush destination counter 718 via cache address multiplexer 726, cache address bus 737 (bits 7-11) and bus 840. The remaining bits ar control bits provided by a pattern generator over bus 841.

The virtual address used to access the user map RAM is itself constructed from the flush destination address and block status label information. Specifically, the block status label information is provided from block status memory 736 over buses 802 and 803 to user map address multiplexer 810. The remainder of the information used to access map RAM 814 is provided from the flush destination counter 718 over the cache address bus 737 and bus 805 (bits 12-14 of the cache address bus).

In the case of mappable supervisor data, the high-order bits (bits 12-31) are provided to multiplexer 838 from the supervisor map register 824 over bus 828 (SMAP bits 12-31). Bits 7-11 of the address are provided from the flush destination counter over the path previously described, and the remaining bits are coded pattern bits.

For unmappable supervisor data, bits 14-23 of the address are generated by bits 14-23 of the block status label provided from the output of block status memory 736 over bus 802 to multiplexer 838. Bits 7-13 of the address are provided from bus 840 from the cache address bus and the remaining bits are set to "0"s. The address information generated by multiplexer 838 is forwarded to the external bus over a path previously described.

After a data transfer has taken place, the flush address is incremented to begin another flush cycle. In state F3A the external sequencer is enabled in order to begin transfer of the flush data to main memory. In line F3B, the WE lead to block status memory 736 is raised in order to clear the dirty and/or valid bits, as appropriate, in the block status memory associated with the block which has just been flushed to main memory.

In lines F3C and F3D, the flush address present at the output of flush destination counter 718 is retained on the cache address bus and the flush address information and block status label at the output of the block status memory is latched in latches 734 and 754, respectively. In line F3E, the WE lead is lowered to the block status memory and, in line F3F, sequencer 700 causes flush address counter 718 to increment to provide the next flush address. Sequencer 700 then returns to flush substate F2 (line F3G).

Operation continues in this manner and dirty blocks are flushed to main memory until the termination flush address is reached. When a non-dirty block is encountered before the flush termination address is reached (or the system is in the clear mode) then processing continues as shown in line F2F of flush substate F2 by jumping to flush substate F4. In line F4A of flush substate F4, the WE to block status memory 736 is raised. This is done to enable the dirty and valid bits to be cleared as appropriate. In particular, in lines F4B and F4C, the flush address is retained and latched to the cache memory and the block status memory is latched to the memory management unit (if the external bus is busy). Since the external sequencer is not enabled, however, the information in the non-dirty block is not transferred into main memory thereby saving a memory cycle. In line F4D of flush state F4, the flush address is again incremented; in line F4E the WE lead is lowered to block status memory 726 and, in line F4F, sequencer 700 returns to flush substate F2.

Alternatively, if a non-dirty block is encountered when the flush termination address is reached (or if the system is proceeding in the clear mode when the flush termination address is reached) as shown in line F2G of flush substate F2, the system proceeds with flush substate F5. In this case, as shown in line F5A, the flush address and block status label are latched to cache address bus and the memory management unit if the external bus is busy. In line F5B, the WE lead to the block status memory is raised in order to clear the dirty and invalid bits, as appropriate. In line F5C, the WE lead is lowered, completing the clearing operation.

In line F5D, sequencer 700 jumps to flush substate F7 in which the flush destination address on the cache address bus and the block status label are latched to the cache memory and memory management unit, respectively (if the external bus is busy). As shown in line F7A of flush substate F7, the system remains in this state until, as shown in line F7B, the external bus becomes non-busy at which point the system jumps to special address acknowledge state S1 to indicate to MPU 702 that the flush operation is complete (as shown in line F7C of flush substate F7).

Finally, if during a normal flush operation the system reaches the termination flush address and the external bus is not busy and the last block to be flushed is dirty, as shown in line F2H of flush state F2, the system jumps to flush substate F6 in which, as shown in line F6A, the external sequencer is enabled in order to transfer the final block to be flushed to the main memory. If the external bus is busy, the flush address and corresponding block status label are latched for temporary storage until the bus becomes not busy, as previously described. Next, as shown in line F6B, the dirty and valid bits stored in the block status memory are cleared as appropriate. Subsequently, the memory enables are lowered (lines F6C and F6D) and the system proceeds to substate F7 at the end of which it enters the acknowledge state S1 to signal to MPU 702 that the flush operation has been completed.

Move State

The final cache operation which will be described in detail is a move operation in which data already stored in cache memory 738 is moved from one area of memory 738 to another area under control of sequencer 700. As previously explained, this type of move is often necessary during certain processing operations, for example, an I/O access operation which requires data to be moved between the supervisor and the user data areas of cache memory, respectively. The substeps in the move operation are shown in Table VI and consist of move substates M1-M6. The corresponding hardware which performs the move operation is shown in FIG. 7 and consists of move register 706, move latch 710, multiplexer 708, source address counters 728 and 746, destination address counters 718 and 744 and multiplexer 740.

TABLE VI

| STATE NAME MOVE (M) | ACTION | CONDITION |
|---|---|---|
| (M1) | | |
| M1A. | Load destination Address Register | Unconditional on Exit |
| M1B. | Enable Source Address to CAB | Unconditional |
| M1C. | Set Cache R/W = Read | Unconditional |
| M1D. | Raise MS and LS byte CE to cache | Unconditional |
| M1E. | Jump to state M2 | Unconditional |
| (M2) | | |
| M2A. | Disable MPU driver to LDB | Unconditional |
| M2B. | Retain Source Add. Enable to CAB | Unconditional |
| M2C. | Enable SDB to LDB | Unconditional |
| M2D. | Retain Cache R/W = Read | Unconditional |
| M2E. | Retain MS and LS byte CE to cache | Unconditional |
| M2F. | Clock Move Register | Unconditional on Exit |
| M2G. | Lower CE to cache | Unconditional on Exit |
| M2H. | Add 2 to Source Address | CM* on Exit |
| M2I. | Jump to state M3 | D0 |
| M2J. | Jump to state M4 | S0 and D0* |
| M2K. | Jump to state M6 | S0* and D0* |
| (M3) | | |
| M3A. | Keep MPU driver to LDB disabled | Unconditional |
| M3B. | Enable Destination Address to CAB | Unconditional |
| M3C. | Enable LDB to SDB | Unconditional |
| M3D. | Set Cache R/W = Write | Unconditional |
| M3E. | Raise LS byte CE to Cache | Falling edge of clock |
| M3F. | Raise WE to BS Memory | Unconditional on falling edge |
| M3G. | Lower CE to cache | Unconditional on Exit |
| M3H. | Lower WE to BS Mem | Unconditional on Exit |
| M3I. | Add 2 to Dest. Addr. | Unconditional on Exit |
| M3J. | Sub 1 from Byte Count | Unconditional on Exit |
| M3K. | Jump to state M4 | B or C0 |
| M3L. | Jump to state S1 | B* or C0 |
| (M4) | | |
| M4A. | Keep MPU driver to LDB disabled | Unconditional |
| M4B. | Enable Source Address to CAB | Unconditional |
| M4C. | Enable SDB to LDB | Unconditional |
| M4D. | Set Cache R/W = Read | Unconditional |
| M4E. | Raise MS and LS byte CE to cache | Unconditional |
| M4F. | Jump to state M5 | Unconditional |
| (M5) | | |
| M5A. | Keep MPU drivers to LDB disabled | Unconditional |
| M5B. | Retain Source Address Enable to CAB | Unconditional |
| M5C. | Enable DSB to LDB | Unconditional |
| M5D. | Retain Cache R/W = Read | Unconditional |
| M5E. | Retain MS and LS byte CE to cache | Unconditional |
| M5F. | Clock Move Register | Unconditional on Exit |
| M5G. | Lower CE to cache | Unconditional on Exit |
| M5H. | Add 2 to Source Addr. | CM* on Exit |
| M5I. | Jump to state M6 | Unconditional |
| (M6) | | |
| M6A. | Keep MPU drivers to LDB disabled | Unconditional |
| M6B. | Enable Destination Address to CAB | Unconditional |
| M6C. | Enable LDB to SDB | Unconditional |
| M6D. | Set Cache R/W = Write | Unconditional |
| M6E. | Raise MS byte CE to Cache | Unconditional |
| M6F. | Raise LS byte CE to cache | Falling edge of clock if more than 1 byte left |
| M6G. | Raise WE to BS Memory | Unconditional on falling edge |
| M6H. | Lower CE to cache | Unconditional on Exit |
| M6I. | Lower WE to BS Mem | Unconditional on Exit |
| M6J. | Add 2 to Dest. Addr. | Unconditional on Exit |
| M6K. | Sub 2 from Byte Count | Unconditional on Exit |
| M6L. | Re-enable MPU drivers to LDB | B* on Exit |
| M6M. | Jump to state M4 | B |
| M6N. | Jump to state S1 | B* |

A move operation is initiated by MPU 702. However, once the move operation is initiated, sequence controller 700 operates independently of MPU 702 to perform the move operation starting at a specified starting address and continuing until a specified destination address is reached. During the time the move operation is being carried out by sequence controller 700, MPU 702 may be used for other tasks thus increasing the efficiency of the system. A move operation has two modes—a "normal" mode in which bytes or words are moved from sequential memory locations to sequential destination addresses and a "constant" mode in which the source address is not incremented so that the same word is moved to several destination locations.

As shown on Table VI, the move operation begins on line M1A when MPU 702 loads the destination address into the destination address register. In particular, since a move operation may be carried out to the byte level, a full seventeen-bit address must be provided to cache memory 738. MPU 702 places the 16-bit LSBs of the destination address on its data leads which address is driven by drivers 716 onto local data bus 732.

The format of the address placed on the internal data bus is shown in FIG. 9, line E2. Bits C00–C15 are the source address bits. FIG. 9, line E4 shows the corresponding data format for a destination address (bits C00–C15 are the destination address bits). For the source address MPU 702 places a special code on the local address bus as shown in FIG. 9, line E1. Bits A23 and A22="1" indicate that the address is an internal special address. Bits BC0–BC6 specify the block count equal to one less than the number of bytes to be moved. Bit S16 is the most significant bit of the source address. A similar code is placed on the local address bus at the time when the destination address is placed on the local data bus as shown in FIG. 9, line E3. In particular, bit CM, when set, indicates that the move operation is a constant mode operation. Bit D16 is the most significant bit of the destination address.

Bits 1–6 of the destination address are loaded into counter 744 from local data bus 732. Bits 7–15 of the local data bus are provided to multiplexer 720 which is controlled by sequencer 700 to load flush/move destination counter 718.

Next, the move source address is placed by MPU 702, via drivers 716, on local data bus 732 and loaded into move source address counters 728 (bits 7–15) and 746 (bits 1–6). By controlling multiplexer 726, sequencer 700 can place either the output of counter 718 or counter 728 on bits 7–15 of the cache address bus 737. Similarly, by controlling multiplexer 749, sequencer 700 can place the output of either counter 744 or 746 on bits 1–6 of cache address bus 737.

As shown in line M1B, sequencer 700 first controls address multiplexer 726 and multiplexer 740 to place the source address from counter 728, via latch 734, and counter 746 on cache address bus 737. Sequencer 700 then places cache memory 738 into a read condition and enables the memory, as shown in lines M1C and M1D and jumps to substate M2, as shown in line M1E.

Cache Memory 738 is arranged to store 16-bit words arranged in two bytes (a most significant (MS) byte and a least significant (LS) byte). The internal connections of the memory are such that either or both bytes may be enabled by means of the MS and LS memory enables.

In substate M2, sequencer 700 controls the move circuitry to move a first byte into move register 706. In particular, as shown in line M2A, sequencer 700 first disables drivers 716 to disconnect MPU 702 from local data bus 732. As shown in line M2B, cache address multiplexer 726 is then controlled to retain the move source address to cache memory 738. Sequencer 700 next enables a path from the output of cache memory 738 to local data bus 732 (line M2C). In particular, sequencer 700 enables drivers 748 to place the output of cache memory 738 onto local data bus 732. The read and enable signals are retained to cache memory 738 (lines M2D and M2E) and the information in the least significant (LS) byte is transferred to the local data bus.

The information on the local data bus is then transferred into the move circuitry. The operation of the move circuitry is conditioned on whether the source address and termination address are word-aligned. Alignment is, in turn, determined by comparing bits 0 of the source and termination addresses. This comparison is carried out in comparator 745, the output of which is used to control multiplexer 708. If the source and destination addresses are word-aligned (bits 0 are equal) then the entire word on local data bus 732 is transferred through multiplexer 708 into register 706. If the addresses are not word-aligned then the LS byte is stored in latch 710 and the MS byte becomes the LS byte of the word stored in register 706. Therefore, the word stored in register 706 has its MS byte equal to the LS byte of the previously moved word and its LS byte equal to the MS byte of the next word to be moved.

Assuming for the moment that the source and destination addresses are word-aligned or there is only one byte to be moved, move multiplexer 708 simply gates the data on local data bus 732 into move register 706. Next, as shown in line M2G, the enable signal is lowered to cache memory 738 thus disabling it. As shown in line M2H, the source address register 728 is then incremented by 2 assuming that the cache move is not a constant mode move.

Next, as shown in substate M2 (lines M2I, M2J and M2K), sequencer 700 makes a decision to proceed based on whether or not the move is word-aligned or not. As shown in state M2I, if bit 0 of the destination address is equal to 1 this indicates that the first byte to be moved is the LS byte, therefore, the first move operation writes only the LS byte which is stored in move register 706.

In particular, as shown in move substate M3, line M3A, MPU drivers 716 remain disabled to separate the local data bus 732 from MPU 702. As shown in line M2B, the destination address is maintained to the cache address bus 737, as previously described. Sequencer 700 now sets up a path from local data bus 732 to shuffle data bus 856 to enable transfer of information from the move register 706 over local data bus 732 into cache memory 738 (line M3C). This path is set up by enabling drivers 852 and 854. Next, sequencer 700 sets the read/write control of cache memory 738 to write and enables the LS byte of the cache memory (lines M3D and M3E) thereby writing the LS byte into the LS byte of the destination location. In addition, the WE lead to the block status memory 736 is also asserted to enable the dirty and valid bits to be written into the block status memory.

After the information has been written in both memories the enables are lowered (line M3G and M3H) and the destination address is incremented by 2 (by incrementing counters 718 and 744, line M3I). The byte counter (not shown) is decremented by 1 indicating that one byte has been transferred.

Sequencer 700 next checks the count remaining in the byte counter to ascertain if there is more than one byte remaining. If so, it proceeds to substate M4 in which another word is read into move register 706. If the move operation has been completed (as indicated by less than one byte remaining) then sequencer 700 proceeds, as shown in line M3L, to the special acknowledge state S1 which acknowledges to MPU 702 that the move operation has been completed.

Assuming that more than one byte remains, in substate M4, line M4A, drivers 716 are kept disabled to prevent interference with the move operation from MPU 702. The source address is again enabled to the cache address bus, as shown in line M4B, by controlling multiplexers 726 and 740 (in a previous state counters 728 and 746 were incremented so that a new source address has been provided to cache address bus 737).

In line M4C, sequencer 700 again re-enables the path from cache memory 738 output to the local data bus to allow information provided on the output of cache RAM 738 to be forwarded to register 706. In line M4D the read/write control of cache memory 738 is set to "read". Sequencer 700 next enables both the LS and MS bytes of the cache memory 738 (line M4E) thus writing both the MS and LS bytes of the word into move register 706 and/or move latch 710 depending on whether the words are word aligned or not. Sequencer 700 then proceeds to sub-state M5 (line M4F).

Substate M5 completes the reading of the word into move register 706 and/or move latch 710. In particular, as shown in lines M5A–M5E read conditions are maintained on cache memory 738. As shown in line M5F, move register 706 is then clocked to read in the information. The cache memory is then disabled and the source address counters 728 and 746 are incremented, as shown in lines M5G and M5H. The sequencer then proceeds to substate M6 (line M5I).

In substate M6, the entire word stored in word register 706 is then written into the cache memory unless there is only one byte to moved in which case only the most significant (MS) byte is moved. In particular, as shown in line M6A, drivers 716 remain disabled. In line M6B, sequencer 700 places the move destination address on cache address bus 737 by enabling multiplexer 726 to provide the destination address stored in counter 718 to the cache address bus 737 and by enabling multiplexer 740 to provide the remainder of the destination address stored in counter 744 to bus 737.

As shown in line M6C the path from local data bus 806 to shuffle data bus 856 is enabled by enabling drivers 852 and 854 so that information can be transferred from move register 706 to the data inputs of cache memory 738. The cache memory is set into the write condition (line M6D) and the enable signal is raised to the most significant byte (M6E) writing the MS byte of the word stored in move register 706 into cache RAM 738. If there is more than one byte left, as shown in line M6F, the LS byte stored in move register 706 is also written into cache memory 738. In addition, as shown in line M6G, the dirty and valid bits in the block status memory are also updated when sequencer 700 asserts the WE lead to memory 736.

Subsequently, the enables are lowered to the memories (lines M6H and M6I). In line M6J, destination counters 718 are 744 are increased by 2 to set them up for the next destination and, in line M6K, the byte counter is decremented by 2 indicating that two bytes have been transferred from move register 706 into cache memory 738.

Finally, as shown in line M6L, drivers 716 are re-enabled to connect MPU 702 to the local data bus 732 in preparation for completion of the move operation. If, however, there are more than two bytes remaining to be transferred, as shown in line M6M, then sequencer 700 jumps to substate M4 and begins the transfer operation once again. If there are less than two bytes remaining to be transferred as shown in line M6N the sequencer jumps to acknowledge state S1 which indicates to MPU 702 that the move operation has been completed.

Although only one illustrative embodiment of the invention has been described herein other changes and modifications will be apparent to those skilled in the art which changes and modifications are within the spirit and scope of the invention and are intended to be covered by the claims herein.

What is claimed is:

1. Memory backup apparatus for a computer system having a plurality of main memories, a processing element for performing data processing tasks and computations on data, said processing element generating write control signals to cause information to be written into said memories and task control signals for controlling said system during a context switch, and means for monitoring fault conditions and for generating fault signals, said backup apparatus comprising, a first main memory area for storing a first copy of retry data;

a second, physically separate main memory area for storing a second copy of retry data, which second retry copy is a duplicate of said first retry copy;

a non-write-through cache memory for temporarily storing the results of computations by said processing element, said cache memory generating a full signal when a predetermined number of storage locations have been written to by said processing element;

first means responsive to said task control signals and to said full signal for temporarily stopping data processing and for transferring a copy of a set of computational results stored in said cache memory to said first main memory area when a data processing task has been completed, when a context switch has been initiated or when said cache memory becomes full to update said first retry data copy, said first means generating a first completion signal when said transfer has been completed;

second means responsive to said first completion signal and to said fault signal for transferring a copy of said set of computational results stored in said cache memory to said second main memory area to update said second retry copy only when the transfer of said set of computational results between said cache memory and said first main memory area has been completed without a fault condition being detected, said second means generating a second completion signal when said second transfer has been completed;

means responsive to said second completion signal and to said fault signals for resuming data processing only if the writing of data from said cache memory into said second memory area has been completed without a fault condition being detected; and means for writing the contents of said second memory area into said first memory area and for restarting the data processing task using data stored in said second memory area if a system failure has occurred after the beginning of a storage operation from said cache memory to said first memory area but before said storage operation has been completed.

2. Memory backup apparatus according to claim 1 further comprising a backup status register and means responsive to the transfer of information between said cache memory and said one and said second memory areas for updating backup status information stored in said register to indicate the start and completion of each data transfer between said cache memory and said first and said second memory areas.

3. Memory backup apparatus according the claim 1 wherein said cache memory is divided into a plurality of data storage blocks which can be independently written and read and said backup apparatus further comprises a block status memory having an entry associated with each data block in said cache memory and means responsive to the storage of computational results from said processing unit into one of said blocks for modifying the associated block status memory entry to indicate that said one data block contains modified data.

4. Memory backup apparatus according to claim 1 wherein said computer system is a multi-tasking computer system and said first transfer means is responsive to a context switch for initiating said transfer of information between said cache memory and said one memory area.

5. Memory backup apparatus for a fault-tolerant computer system having system memories for storing data, a processing element for performing a plurality of data processing tasks and computations, said processing means generating write control signals to cause information to be written into said system memories and task control signals for controlling said system during a context switch, and means for monitoring fault occurrences in said computer system and for generating fault signals, said backup apparatus comprising, a first memory area and a second, physically separate memory area located in said system memories, said memory areas storing duplicate copies of data and subsequent computational results generated by said processing element;

a temporary storage area, said storage area generating a full signal when a predetermined number of storage locations in said memory has been written to;

first means responsive to said write signals for writing data from said first memory area into said temporary storage area and for writing computational results produced by said processing element into said temporary storage area;

second means responsive to said full signal and to said task control signals for writing selected portions of said temporary storage area into said first memory area when said temporary storage area is full or when said task control signals indicate a context switch is requested, said second means producing a completion siganl when said writing has been completed;

third means responsive to said completion signal and to said fault signals for writing said selected portions of said temporary storage are into said second memory area when the writing of data from said temporary storage area into said first memory area had been completed without a fault condition being detected; and means for writing the contents of said second memory area into said first memory area and for restarting the data processing task using data stored in said second memory area if a system failure has occurred after the beginning of a storage operation from said temporary storage area to said first memory area but before said storage operation has been completed.

6. Memory backup apparatus according to claim 5 wherein said temporary storage area is divided into a plurality of data storage blocks which can be independently written and read and said memory backup apparatus further comprises a block status memory having a location therein associated with each one of said data storage blocks and means for recording block status information in each of said status memory locations, said block status information identifying data storage blocks which have been written with computational results generative by said processing element.

7. Memory backup apparatus according to claim 5 wherein said block status information identifies whether the associated data storage block has been written with computational results generated by said processing element.

8. Memory backup apparatus in accordance with claim 6 further comprising means responsive to said block status information for controlling said second and third writing means to write to said memory areas only those portions of said temporary storage area which contain computational results generated by said processing element.

9. Memory backup apparatus in accordance with claim 5 further comprising a backup status register, means connected to said second and said third writing means for updating backup status information stored in said backup status register, said backup status information identifying memory areas which have been written from said temporary storage area.

10. Memory backup apparatus in accordance with claim 9 wherein said second writing means generates a start signal at the beginning of a storage operation to said first memory area and said updating means is responsive to said start signal for updating said backup status register and is responsive to said completion signal for updating said backup status register.

11. Memory backup apparatus in accordance with claim 10 further comprising means responsive to said backup status information for restarting a data processing task utilizing said initial data stored in said first memory area if a system failure has occurred before the beginning of a storage operation from said temporary storage area to said first memory area.

12. A method for backing up data in a computer system having a plurality of main memories, including a first main memory, a second, physically separate main memory area and a non-write-through cache memory, a processing element for performing data processing tasks and computations on data, and means for detecting the occurrence of a fault condition, said method comprising the steps of:

A. placing duplicate copies of data in said first and second main memory area;

B. storing copies of computational results generated by said processing element in said cache memory during data processing of a task;

C. temporarily stopping data processing and transferring a copy of a set of computational results stored in said cache memory to said first main memory area when a data processing task has been completed, when a contact switch has been initiated or when said cache memory becomes full to update said first retry data copy;

D. transferring a copy of said set of computational results stored in said cache memory to said second main memory area to update said second retry copy only when the transfer of said set of computational results between said cache memory and said first main memory area has been completed without a fault condition being detected;

E. resuming data processing only if the writing of data from said cache memory into said second memory area has been completed without a fault condition being detected; and F. writing the contents of said second memory area into said first memory area and restarting the data processing task using data retry stored in said second memory area if a system failure has occurred after the beginning of a storage operation from said cache memory to said first memory area but before said storage operation has been completed.

13. A method for backing up data in a fault-tolerant computer system having first, second and third system memories for storing data, a processing element for performing a plurality of data processing tasks and computations, and means for detecting the occurrences of a fault in said computer system, said method comprising the steps of:

A. placing duplicate copies of data in said first and third memories and, during the processing of a task, writing data associated with said task from said first memory into said second memory and writing computational results produced by said processing element into said second memory;

B. detecting a context switch condition or a memory full condition in which a predetermined number of storage locations have been written to;

C. after a context switch has been initiated or after a memory full condition has been detected copying selected portions of said second memory into said first memory;

D. copying said selected portions of said second memory into said third memory when the copying of data from said second memory into said first memory area has been completed without a fault condition being detected; and E. writing the contents of said third memory into said first memory and restarting the data processing task using data stored in said third memory area if a system failure has occurred after the beginning of a storage operation from said second memory to said first memory but before said storage operation has been completed.

14. A method for backing up data in a fault-tolerant computer system according to claim 13 wherein step A further comprises the steps of:

A1. marking storage locations in said second memory which have been modified by said processing element.

15. A method for backing up data in a fault-tolerant computer system according to claim 14 wherein step C further comprises the steps of:

C1. copying the contents of only those storage locations which have been marked as modified by said processing element to said first memory.

16. A method for backing up data in a fault-tolerant computer system according to claim 13 wherein said computer system further comprises a status register and step C further comprises the steps of:

C2. checking said fault detector to determine if a fault has been detected,

C3. storing a first status code in said status register indicating that the copying of selected portions of said second memory to said first memory has begun if no fault has been detected in step C2.

17. A method for backing up data in a fault-tolerant computer system according to claim 16 wherein step C further comprises the steps of:

C4. detecting the completion of the copying of said selected portions of said second memory to said first memory, and C5. checking said fault detector to determine if a fault has been detected, C6. storing a status code in said status register if no fault has been detected in step C5, said second status code indicating that the copying of selected portions of said second memory to said first memory has been completed.

18. A method for backing up data in a fault-tolerant computer system according to claim 17 wherein step D further comprises the steps of:

D1. checking said status register to obtain the status code stored therein, and

D2. checking said fault detector to determine if a fault has been detected,

D3. storing a third status code in said register when said status code stored in said register is said second status code and no fault has been detected in step D2, said third code indicating that copying of said selected portions of said second memory to said third memory has begun.

19. A method for backing up data in a fault-tolerant computer system according to claim 18 further comprising the steps of:

F. restarting said system using data stored in said first memory if a fault is detected in step C2.

20. A method for backing up data in a fault-tolerant computer system according to claim 18 further comprising the steps of:

G. restarting said system using data stored in said third memory if a fault is detected in step C5.

21. Memory backup apparatus as defined in claim 1 further comprising means responsive to a system failure after the beginning of a storage operation from said cache memory to said second memory area but before said storage operation to said second memory area has been completed, for selecting a third memory area and for transferring a copy of said set of computational results stored in said cache memory to said third memory area to provide an updated second copy of retry data.

22. Memory backup apparatus as defined in claim 12 further comprising means responsive to a system failure after the beginning of a storage operation from said temporary storage area to said second memory area but before said storage operation to said second memory area has been completed for selecting a third memory area and for transferring selected portions of said temporary storage area into said third memory area.

23. A method for backing up data in a computer system as defined in claim 12 further including the steps of selecting a third memory area if a system failure occurred after the beginning of a storage operation from said cache memory to said second memory area but before said storage operation to said second memory area has been completed, and transferring a copy of said set of computational results stored in said cache memory to said third memory area.

24. A method for backing up data in a fault-tolerant computer system as defined in claim 13 further including the steps of selecting a fourth memory area if a system failure occurrred after the beginning of a copying operation from said second memory into said third memory but before said copying operation into said third memory has been completed, and copying said selected portions of said second memory into said fourth memory.

* * * * *